United States Patent
Kim

(10) Patent No.: US 8,941,387 B2
(45) Date of Patent: Jan. 27, 2015

(54) APPARATUS AND METHOD FOR FAULT DETECTION AND LOCATION DETERMINATION

(75) Inventor: Charles Kim, Annandale, VA (US)

(73) Assignees: Howard University, Washington, DC (US); San Diego Gas & Electric Company, San Diego, CA (US)

( * ) Notice: Subject to any disclaimer, the term of this patent is extended or adjusted under 35 U.S.C. 154(b) by 662 days.

(21) Appl. No.: 12/902,819

(22) Filed: Oct. 12, 2010

(65) Prior Publication Data

US 2012/0086459 A1   Apr. 12, 2012

(51) Int. Cl.
  *G01R 31/08* (2006.01)
  *G01R 29/18* (2006.01)

(52) U.S. Cl.
  CPC .............. *G01R 31/086* (2013.01); *G01R 29/18* (2013.01); *Y04S 10/522* (2013.01)
  USPC ................ 324/522; 324/525; 702/59; 702/64

(58) Field of Classification Search
  CPC .................. G01R 31/086; G01R 31/08–31/11; Y04S 10/522; Y04S 10/50–10/60; H02H 3/00–3/52
  USPC ......... 324/500, 509, 512, 522, 524, 525, 649, 324/654; 702/57–80
  See application file for complete search history.

(56) References Cited

U.S. PATENT DOCUMENTS

| | | | | |
|---|---|---|---|---|
| 4,390,835 A | * | 6/1983 | Elkateb et al. | 324/539 |
| 5,659,453 A | * | 8/1997 | Russell et al. | 361/93.1 |
| 5,661,664 A | * | 8/1997 | Novosel et al. | 700/293 |
| 5,825,189 A | * | 10/1998 | Johns | 324/525 |
| 5,839,093 A | * | 11/1998 | Novosel et al. | 702/59 |
| 6,198,401 B1 | | 3/2001 | Newton et al. | |

(Continued)

FOREIGN PATENT DOCUMENTS

| CN | 101542662 | | 9/2009 |
|---|---|---|---|
| WO | WO 2008064946 A1 | * | 6/2008 |

(Continued)

OTHER PUBLICATIONS

IEEE Std C37.114-2004—IEEE Guide for Determining Fault Location on AC Transmission and Distribution Lines; Published Jun. 20, 2005.*

(Continued)

*Primary Examiner* — Huy Q Phan
*Assistant Examiner* — James Split
(74) *Attorney, Agent, or Firm* — Fitch, Even, Tabin & Flanny LLP

(57) ABSTRACT

An electrical waveform is received over an electrical power line. A plurality of nominal electrical parameters are determined for the electrical power network and the plurality of nominal electrical parameters are associated with a state of the electrical power network in the absence of at least one transitory electrical fault in the network. Subsequently, a plurality of electrical parameters of the electrical waveform are sampled when the at least one transitory electrical fault exists in the network. A plurality of inductances are determined based at least in part upon a comparison of the nominal electrical parameters and the plurality of sampled electrical parameters. The plurality of inductances are representative of inductances present in the network when the at least one transitory electrical fault exists in the network. The plurality of inductances are analyzed to determine a distance and/or direction to the at least one electrical fault.

15 Claims, 15 Drawing Sheets

(56) References Cited

U.S. PATENT DOCUMENTS

| | | | |
|---|---|---|---|
| 6,483,435 B2 * | 11/2002 | Saha et al. | 340/650 |
| 6,828,770 B1 * | 12/2004 | McCauley et al. | 324/117 R |
| 6,987,389 B1 * | 1/2006 | Macbeth et al. | 324/536 |
| 7,286,963 B2 * | 10/2007 | Saha et al. | 702/182 |
| 7,872,478 B2 * | 1/2011 | Saha et al. | 324/512 |
| 8,067,942 B2 * | 11/2011 | Pan et al. | 324/509 |
| 2005/0163308 A1 | 7/2005 | Smith et al. | |
| 2009/0088988 A1 * | 4/2009 | Muthu-Mannivannan et al. | 702/58 |
| 2011/0043214 A1 * | 2/2011 | Potter et al. | 324/525 |
| 2012/0123708 A1 * | 5/2012 | Dong et al. | 702/58 |

FOREIGN PATENT DOCUMENTS

| | | |
|---|---|---|
| WO | 2010022559 | 4/2010 |
| WO | WO 2010115474 A1 * | 10/2010 |

OTHER PUBLICATIONS

S. Horton and N. van Luijk, "Low voltage fault detection and localization using the Topas 1000 disturbance recorder," Electric Power Quality and Utilization Magazine, vol. 2, No. 1, pp. 27-32, 2006.

J. Livie, P. Gale, and A. Wang, "Experience with on-line low voltage cable fault location techniques in Scottish power," 19th International Conference on Electricity Distribution (CIRED), May 21-24, 2007, Vienna, Austria.

L. Kojovic and C. Williams, "Sub-cycle detection of incipient cable splice faults to prevent cable damage," Proc. IEEE Power Engineering Society Summer Meeting, 2000. vol. 2, pp. 1175-1180, Jul. 16-20, 2000, Seattle, WA, USA.

M. McGranaghan, T. Short, D. Sabin, "Using PQ Monitoring Infrastructure for Automatic Fault Location," 19th International Conference on Electricity Distribution (CIRED), May 21-24, 2007, Vienna, Austria.

C. Kim, T. Bialek, M. Lehtonen, and M. F. Abdel-Fattah, "Location of Underground Cable Transitory Faults," 2011 IPST Conference, Jun. 14-17, 2011, Delft, Netherlands.

C. Kim and T. Bialek, "Sub-Cycle Ground Fault Location—Formulation and Preliminary Results," IEEE 2011 IEEE Power Systems Conference & Exposition Mar. 20-23, 2011, Phoenix, AZ.

T. S. Sidhu and Z. Xu, "Detection of Incipient Faults in Distribution Underground Cables," IEEE Transactions on Power Delivery, vol. 25, No. 3, Jul. 2010 p. 1363.

International Search Report dated Mar. 2, 2012 relating to PCT/US2011/055582.

D.L. Waikar et al., IEEE Transaction on Power Delivery, vol. 9, No. 3, Jul. 1994, Fault Impedance Estimation Algorithm for Digital Distance Relaying, 1994 IEEE, 9 pages.

* cited by examiner ness of digital signal processing in the calculation of the magnitude and phase angle of a digitized signal). Then, once these values are obtained, a determination as to where a fault exists may be made. In other words, the above-mentioned previous approaches must wait until after the onset of fault through the transient period of fault behavior, for the occurrence of a post-fault steady state voltage and current and only then, after obtaining these values, calculate the magnitude and phase angle for the voltage and current and thereby locate a fault.

APPARATUS AND METHOD FOR FAULT DETECTION AND LOCATION DETERMINATION

FIELD OF THE INVENTION

This application relates to fault detection and, more specifically to determining fault location and/or direction of faults in electrical networks.

BACKGROUND

Various approaches have been used over the years to detect and/or locate electrical faults in electrical networks. In some of these approaches, a reactance algorithm is used to detect and/or locate the faults. More specifically, the magnitudes of the voltage and current of faulted phase and the phase angle between the voltage and the current are determined. Since the voltage and current data are typically obtained from a data sampling device, calculation of the phase angles and the difference in the phase angles requires a steady-state pure sinusoidal segment of voltage and current for at least two power cycles (due to the theoretical require Unfortunately, a large portion of permanent faults and the most transitory/intermittent faults (which are often the precursors of permanent faults) do not produce the desired long post-fault steady-state behavior. Instead, these faults quickly disappear right after a short-lived transient period without reaching a steady state. The majority of short-lived, transient-period only faults, whether they are permanent, transitory, or intermittent, last only about one cycle length of time. For example, underground insulation breakdown intermittent faults (for underground cable) or overhead power lines typically last less than one cycle, most often for about ½ cycle or less. These sub-cycle faults, which may lead to permanent faults, need to be located or loss of electric service may occur as the intermittent faults develop into permanent faults. The conventional fault location approaches described above are incapable of locating sub-cycle faults. In fact, in most cases, these faults are simply ignored by these previous approaches. Therefore, determination of distance to such a sub-cycle fault (intermittent or permanent) is not attempted.

Figure 1:
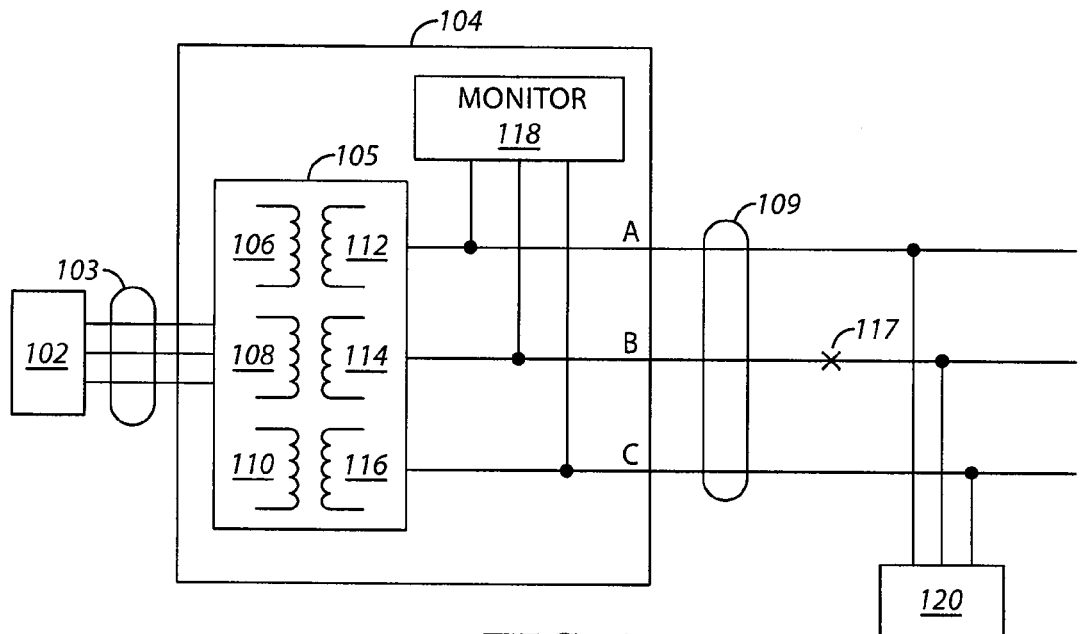
FIG. 1 comprises a block diagram of a system that determines a distance to a fault according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE PREFERRED EMBODIMENTS

Approaches are provided that locate sub-cycle faults (both permanent and intermittent) in electric power circuits. The approaches described herein sometimes employ injection approaches and calculate the source impedance under fault conditions. Then, a calculation of the line inductance to the faulted location is made and this line inductance may be multiplied by the known distance/inductance factor of the line to determine the actual physical distance (e.g., in meters, feet, and so forth) from a measuring device to the fault. Additionally, a determination can be made as to whether the fault is upstream or down stream of the measuring device. A determination may also be made as to whether the fault is at the same or different line in the same bus, or at same bus line or different bus line of multi-bus configuration, based at least in part upon a polarity of the determined source inductance.

In many of these embodiments, the calculation of source inductance and fault distance is accomplished by using the voltage and current signals measured at, for example, a substation (or some other suitable location) and by applying a time domain differential equation to inversely obtain the inductance from the transient waveform represented by the signals. Advantageously, the approaches described herein do not require prior information concerning the impedance of the circuit. In this respect, the source inductance of a substation circuit can be obtained and the source inductance is used for faulted phase identification and, consequently, for classification of faults. The approaches described herein can utilize time domain signal analysis since the signal itself, in transient or steady-state, reveals the circuit and the circuit components from which the signal is obtained and analyzed.

Simplification of a circuit and its component does not change significantly the signal by considering only the reactance (i.e., inductance and capacitance) of the circuit, especially in power circuit in which circuit components are reactive dominant. In some aspects, consideration only of the reactance of a circuit in fault location provides a close realization of an actual circuit. The reactance-only circuit analysis approaches described herein have additional advantages. For example, these approaches provide for the elimination of resistors (typically of customer loads) in the circuit analysis, which makes the approach load independent.

In the signal analysis approaches described herein, the net fault voltage and current are typically considered and these values can be obtained by subtracting the nominal voltage and current from the faulted voltage and current, respectively. Applying the present approaches theoretically converts the short-circuited fault condition (which has zero voltage between the faulted phase and the ground) to a fictitious voltage source of the same but negative polarity of nominal value injected at the faulted location. The fault condition at the fault location can be represented by injecting the negative polarity of the voltage at a potential fault location immediately before the fault inception time. Under this injection approach, the circuit of fault condition is considered to be supplied by two sources: the main power source of substation and the injected voltage source. A circuit value (voltage or current) is obtained for the two-source circuit using the superposition principle by adding its component values under only either source activated with the other source deactivated, and vice versa. Since the present approach utilizes the net fault value (voltage or current), it considers only the injected voltage source as the sole source of the fault circuit but ignores the main source in the circuit value calculation. The amount of the injected voltage under the assumed reactive circuit condition is the same as the nominal value at the time immediately before the fault inception. Advantageously, the approaches described herein need only a substation or some other suitable location-measured values of voltage and current. No additional information other than these is necessary.

Further, the approaches describe herein obtain a calculation of the fault distance that accommodates all types of capacitor bank connections to substation buses, for example, grounded Y-connected capacitor banks, ungrounded capacitor banks, and no capacitor banks. Other examples are possible. Additionally, the fault distance is expressed as an inductance value from substation. Since the analysis period of sub-cycle fault location contains the transient behavior of a circuit (and which usually contains other frequencies than the nominal frequency of f=60 Hz) the magnitude of the reactance (which has a magnitude defined as $2*(pi)*f*L$ (for inductance L) or $1/(2*(pi)*f*C)$ (for a capacitance C)) cannot be applied. However, with minor errors accepted, the determined inductance as a fault distance can be roughly interpreted as a reactance using the definition for nominal frequency of the circuit.

The sub-cycle faults are sometimes single line to ground faults. However, the sub-cycle faults may also be line-to-line faults and all other types of faults. Therefore, the fault distance calculation is described herein for all types of fault in a three-phase power circuit system. These approaches can be used in other types of electrical systems as well.

In some of these embodiments, an electrical waveform is received over an electrical power line. A plurality of nominal electrical parameters are determined for the electrical power network and the plurality of nominal electrical parameters are associated with a state of the electrical power network in the absence of at least one transitory electrical fault in the network. Subsequently, a plurality of electrical parameters of the electrical waveform are sampled when the at least one transitory electrical fault exists in the network. A plurality of inductances are determined based at least in part upon a comparison of the nominal electrical parameters and the plurality of sampled electrical parameters. The plurality of inductances are representative of inductances present in the network when the at least one transitory electrical fault exists in the network. The plurality of inductances are analyzed to determine a distance to the at least one electrical fault.

The sampled electrical parameters may relate to a wide variety of network conditions. For example, the plurality of sampled electrical parameters may be voltages and currents. Other examples are possible.

In other aspects, a fault type is determined based at least in part upon the plurality of sampled electrical parameters. The fault type may be a line-to-ground fault and a line-to-line fault. Other examples are possible.

In some other aspects, the comparison of the plurality of sampled parameters to the plurality of nominal electrical parameters is used to determine if a fault has occurred. Various approaches to analyzing may also be used. For example, the analyzing may include multiplying at least some of the plurality of fault inductances by a known inductance characteristic of the power line to obtain the actual physical distance (e.g., as measured in meters, feet, and so forth) to the transitory fault. The comparison may also use various approaches and mathematical operations. For instance, the comparison of the plurality of nominal electrical parameters and the plurality of sampled electrical parameters may including performing a subtraction between the plurality of nominal electrical parameters and the plurality of sampled electrical parameters. Other examples of analyzing and comparing are possible.

Determining a source inductance may be made based at least in part upon a comparison of the plurality of nominal electrical parameters and the plurality of sampled electrical parameters. Determining whether the transitory fault is located at an upstream location or a downstream location may be made based at least in part upon a polarity of the determined source inductances.

In others of these embodiments, a distance to an electrical fault in an electrical network is determined. At least one first network operational parameter is determined and the first network operational parameter is related to a first electrical condition of the network in the absence of a transitory fault. At least one second network operational parameter is determined and the at least one network operational second parameter is related to a second electrical condition of the network in the presence of the transitory fault. An inductive distance to the fault based is determined at least in part upon a comparison of the at least one first network operational parameter to the at least one second network operational parameter.

Determining the second network operational parameter may include sampling electrical voltages or electrical currents. Further, a fault type may be determined based at least in part upon at least one of the at least one first network operational parameter and the at least one second network operational parameter. The fault type may be a number of types. For example, the fault type may be a line-to-ground fault and a line-to-line fault. Other examples of fault types are possible. In other aspects, the comparing is used to determine if a fault has occurred.

In still others of these embodiments, a system for determining fault distance includes an interface and a processor. The interface includes an input and an output and is configured to receive an electrical waveform over an electrical power line at the input.

The processor is coupled to the interface. The processor is configured to determine a plurality of nominal electrical parameters for the electrical power network and the nominal electrical parameters associated with a state of the electrical power network in the absence of at least one transitory electrical fault. The processor is also configured to subsequently sample a plurality of electrical parameters of the electrical power waveform at the input when the at least one transitory electrical fault exists in the network. The processor is further configured to determine a plurality of inductances based at least in part upon a comparison of the nominal electrical parameters and the plurality of sampled electrical parameters. The plurality of inductances are representative of inductances present in the network when the at least one transitory electrical fault exists in the network. The processor is configured to analyze the plurality of inductances to determine a distance to the at least one transitory electrical fault and present the distance at the output.

The plurality of sampled electrical parameters may be a wide variety of parameters such as electrical voltages and electrical currents. The processor may also be configured to determine a fault type based at least in part upon the plurality of sampled electrical parameters. The fault type may be a line-to-ground fault and a line-to-line fault to mention two examples. In other aspects, the comparison of the plurality of sampled electrical parameters to the plurality of nominal electrical parameters is used to determine if a fault has occurred. In other examples, the distance to the at least one transitory fault is determined by multiplying at least some of the fault inductances by a known inductance characteristic of the power line.

Referring now to FIG. 1, one example of a system that determines a distance to a fault is described. The system includes an electrical generator/transmitter 102 that transmits three-phase electrical power over transmission lines 103 to a substation 104. The substation 104 transforms (e.g., reduces) the voltage or other characteristics of the transmitted power and supplies the power to a consumer 120 via transmission lines 109. The substation transformer 105 includes primary coils 106, 108, and 110 and secondary coils 112, 114, and 116. The coils form transformers that transform the power received over the input lines 103 to the output lines (represented as A, B, and C). A monitoring device 118 monitors the power and the output of the substation 104 and determines the existence of an electrical fault 117 as well as the distance to the fault 117.

The electrical generator/transmitter 102 may be any type of power supply arrangement. For example, the electrical generator/transmitter 102 may be a power grid, a power plant, another substation, or any other type of arrangement that supplies electrical power.

The consumer 120 may be a home, business, office, school, or any other type of power consumer. Although only one consumer is shown, it will be appreciated that other consumers may also exist. Also, it will be understood that other transmission lines may also exist and that these may be arranged in any architecture or configuration.

The monitoring device 118 may be any combination of computer hardware and software that is used to determine a distance to a fault, in this example, the electrical fault 117. It will be appreciated that the electrical fault 117 is one example of a fault disposed in one location and that electrical faults may exist at other locations anywhere in FIG. 1. The fault 117 may be an intermittent fault, that is, a fault that are physical events that manifest themselves occasionally and in often unpredictable ways within electrical systems or networks. Although capable of detecting and locating transitory/intermittent faults, it will be appreciated that the approaches described herein can locate all types of faults including permanent faults.

When an intermittent/transitory fault occurs in a system, the system may produce erroneous results and return back to a normal state. To take a typical example of particular electrical faults that occur in networks, an underground cable may be water damaged and a small electrical arc may be created as a result of the moisture seepage. In this example, the fault lasts only 1 cycle or so and the normal state is quickly restored as if nothing happened after moisture is evaporated by the short arc.

In one example of the operation of the system of FIG. 1, an electrical waveform is received over the electrical power lines 109 and at the monitoring device 118. A plurality of nominal electrical parameters are determined for the electrical power network by the monitor 108 and the plurality of nominal electrical parameters are associated with a state of the electrical power network in the absence of at least one transitory electrical fault in the network. Subsequently, a plurality of electrical parameters of the electrical power waveform are sampled when the at least one transitory electrical fault (e.g., the fault 117) exists in the network. A plurality of inductances are determined by the monitoring device 118 based at least in part upon a comparison of the nominal electrical parameters and the plurality of sampled electrical parameters. The plurality of inductances are representative of inductances present in the network when the at least one transitory electrical fault exists in the network. The plurality of inductances are analyzed to determine a distance to the at least one electrical fault 117.

The sampled electrical parameters may relate to a wide variety of network conditions. For example, the plurality of sampled electrical parameters may be voltages and currents. Other examples are possible. A fault type based at least in part upon the plurality of sampled electrical parameters may also be determined by the monitoring device 118. The fault type may be a line-to-ground fault and a line-to-line fault. Other examples are possible.

In some other aspects, the comparison of the plurality of sampled parameters to the plurality of nominal electrical parameters by the monitoring device 118 is used to determine if a fault has occurred. Various approaches to analyzing may also be used by the monitoring device 118. For example, the analyzing by the monitoring device 118 may include multiplying at least some of the plurality of fault inductances by a known inductance characteristic of the power line to obtain the distance to the transitory fault. The comparing by the monitoring device 118 may also use different approaches and mathematical operations. For instance, the comparison of the plurality of nominal electrical parameters and the plurality of sampled electrical parameters by the monitoring device 118 may including performing a subtraction between the plurality of nominal electrical parameters and the plurality of sampled electrical parameters. Other examples of analyzing and comparing are possible.

Determining a source inductance by the monitoring device 118 may be made based at least in part upon a comparison of the plurality of nominal electrical parameters and the plurality of sampled electrical parameters. Determining whether the transitory fault is located at an upstream location or a downstream location may be made by the monitoring device 118 based at least in part upon a polarity of the determined source inductance.

In another example of the operation of the system of FIG. 1, a distance to the electrical fault 117 in an electrical network is determined. At least one first network operational parameter is determined by the monitoring device 118 and the at least one first network operational parameter is related to a first electrical condition of the network in the absence of a transitory fault. At least one second network operational parameter is determined by the monitoring device 118 and the at least one network operational second parameter is related to a second electrical condition of the network in the presence of the transitory fault. An inductive distance to the fault based is determined by the monitoring device 118 at least in part upon a comparison of the at least one first network operational parameter to the at least one second network operational parameter.

Determining the second network operational parameter by the monitoring device 118 may include sampling electrical voltages or electrical currents. Further, a fault type may be determined by the monitoring device 118 based at least in part upon at least one of the at least one first network operational parameter and the at least one second network operational parameter. The fault type may be a number of types. For example, the fault type may be a line-to-ground fault and a line-to-line fault. Other examples are possible. In other aspects, the comparing is used to determine if a fault has occurred. Also, a determination may be made as to whether the fault is upstream or downstream of the measuring device.

Figure 2:
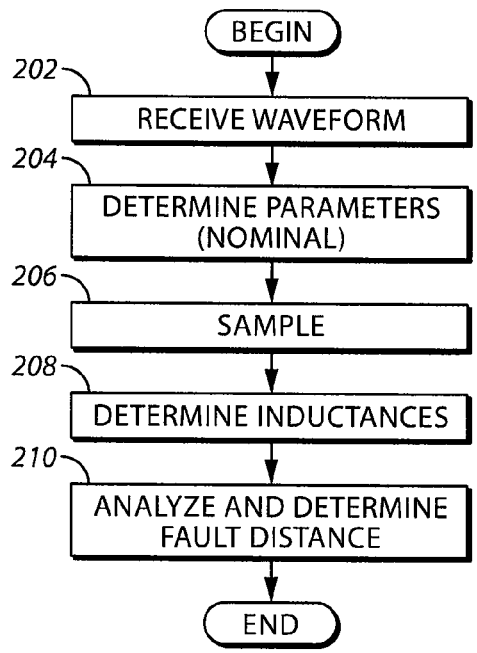
FIG. 2 comprises a flowchart of one approach that determines a distance to a fault according to various embodiments of the present invention.

Referring now to FIG. 2, one example of an approach for determining a distance to a fault is described. At step 202, an electrical waveform is received from an electrical power line (e.g., a line in a three-phase electrical system).

At step 204, a plurality of nominal electrical parameters are determined for the electrical power network and the plurality of nominal electrical parameters are associated with a state of the electrical power network in the absence of at least one transitory electrical fault in the network.

At step 206, a plurality of electrical parameters of the electrical waveform are sampled when the at least one transitory electrical fault exists in the network.

At step 208, a plurality of inductances are determined based at least in part upon a comparison of the nominal electrical parameters and the plurality of sampled electrical parameters. The plurality of inductances are representative of inductances present in the network when at least one transitory electrical fault exists in the network. At step 210, the plurality of inductances are analyzed to determine a distance to the at least one electrical fault.

Figure 3:
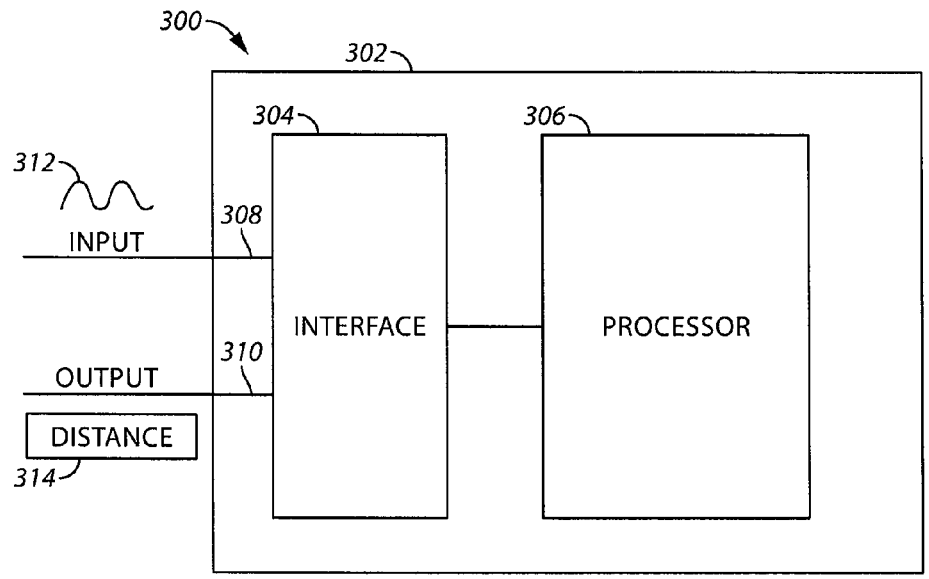
FIG. 3 comprises a block diagram of an apparatus that determines a distance to a fault according to various embodiments of the present invention.

Referring now to FIG. 3, one example of an apparatus configured to determine the distance to an electrical fault is described. The apparatus 302, which can be separated from or integrated with the monitoring device includes an interface 304 and a processor 306.

The interface 304 includes an input 308 and an output 310 and is configured to receive an electrical waveform 312 from an electrical power line at the input 308.

The processor 306 is coupled to the interface 304. The processor 306 is configured to determine a plurality of nominal electrical parameters for the electrical power network and the nominal electrical parameters associated with a state of the electrical power network in the absence of at least one transitory electrical fault. The processor 306 is also configured to subsequently sample a plurality of electrical parameters of the electrical waveform 312 at the input 308 when the at least one transitory electrical fault exists in the network. The processor 306 is further configured to determine a plurality of inductances based at least in part upon a comparison of the nominal electrical parameters and the plurality of sampled electrical parameters. The plurality of inductances are representative of inductances present in the network when the at least one transitory electrical fault exists in the network. The processor 306 is configured to analyze the plurality of inductances to determine a distance 314 to the at least one transitory electrical fault and present the distance 314 at the output 310.

The plurality of sampled electrical parameters may be a wide variety of parameters such as electrical voltages and electrical currents. The processor 306 may also be configured to determine a fault type based at least in part upon the plurality of sampled electrical parameters. The fault type may be a line-to-ground fault and a line-to-line fault to mention two examples. In other aspects, the comparison of the plurality of sampled electrical parameters to the plurality of nominal electrical parameters made by the processor 306 is used to determine if a fault has occurred. In other examples, the distance to the at least one transitory fault is determined by the processor 306 multiplying at least some of the fault inductances by a known inductance characteristic of the power line.

Referring to the remaining drawings (FIGS. 5-31) of this application, it will be appreciated that various inductances, power sources, and other electrical elements are shown. These are described with respect to FIG. 4 and generally speaking they will not be described again with respect to the remaining figures.

Figure 4:
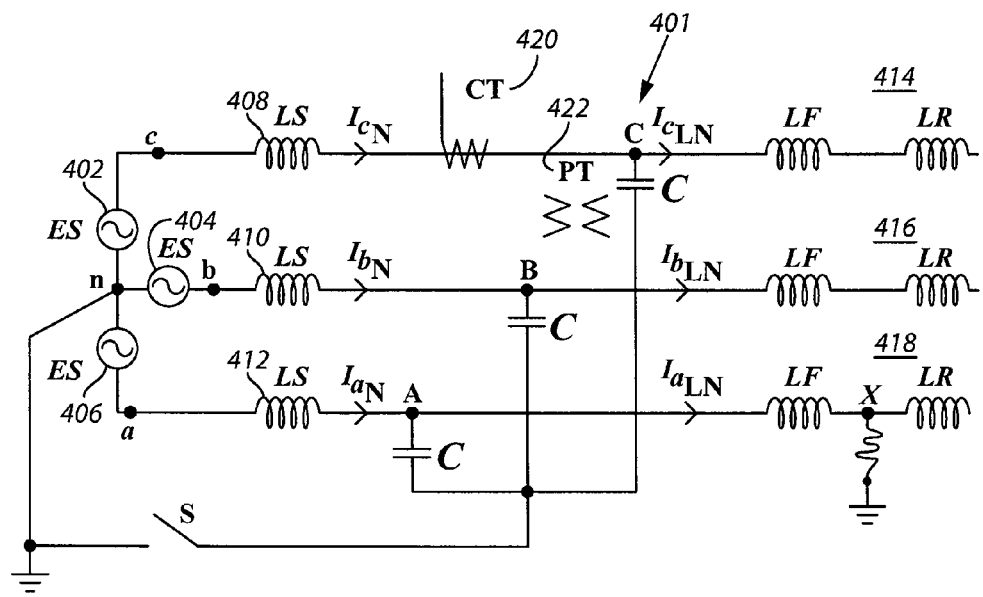
FIG. 4 comprises a circuit diagram of a circuit showing one example of a fault according to various embodiments of the present invention.

Referring now to FIG. 4, a typical substation is served from one or more transformers, and one or more capacitor banks 401 are connected to the substation bus. From the bus, multiple circuits operate to serve loads (e.g., consumer loads, homes, appliances, businesses, and so forth). Considering a substation which is serving only a circuit, the substation and the circuit can be equivalent to, in a lumped parameter approach, three-phase sinusoidal sources 402, 404, and 406, three-phase source inductors 408, 410, and 412, and three line inductors 414, 416, and 418, ignoring all resistive components.

Referring to such equivalent three-phase system in FIG. 4 where a phase A to ground fault occurs at location X, derivation of fault distance formula for each of the entire classes of faults is now described. ES is a phase voltage source and LS is a phase source inductance both drawn from the substation transformer and C, with the other two, indicates the capacitor bank. LF is a phase inductance of the cable (or overhead line) from substation to the imaginary fault point (X) of the three-phase circuit and LR is the phase inductance of the circuit from the fault point to the end of the circuit.

All resistive components of the circuit, transformer, and load are ignored in the present analysis and distance calculation. The switch S indicates that the Y-connected capacitors are operating either grounded at the node or ungrounded. When C is removed from FIG. 4, then it becomes the third connection type of no-capacitor case.

Referring to FIG. 4 again, a three-phase current transformer (CT) 420 and a three-phase voltage transformer (PT) 422 are used as the probes for three-phase currents and voltages. Data event recording at substation is done by using the probes with recording and tele-metering or remote access medium. One CT and a PT in the figure at phase C collectively indicate that the other two phases are also probed by such CT and VT for their voltages and currents. The substation measurement using the recording device is conducted by tapping the bus. Therefore, the measured voltage is the bus voltage and the measured current is the current from the main source, which may indicate the combined current to multiple circuits connected to the bus. For a substation with one three-phase circuit, the measured current at the substation is the sum of the current through the capacitor and that of the current through the circuit, the latter two are usually unknown and immeasurable. As stated above, the fault distance formula derivation to the point X (which is the inductance LF) accomplishes the task by using only the substation or a suitable location measured) measured voltages and currents.

Now referring to phase A of the circuit of FIG. 4 and its fault to ground ("AE fault") at the location X, the formula for fault distance LF is described with respect to three different capacitor connection types. When the AE fault occurs at time t=tF at the location X with zero fault resistance, the voltage at X at time tF, Vax(tF), becomes zero. The voltage zero at X can be represented alternatively as an injection of the negative polarity of the would-be normal voltage at tF, −Vax(tF), at location X to the system. Moreover, since only the change of voltage and current due to the fault is utilized by many of the approaches described herein (rather than the total voltage by both the injected voltage and the source voltage), by applying the superposition principle, for the point of view of net voltage, there is only the injected voltage in the circuit as the sole source after deactivating the sinusoidal source voltages from the circuit. For the grounded capacitor case, this superposition approach of voltage injection for net voltage and current analysis converts the circuit of FIG. 4 to that of FIG. 5A.

Figure 5A:
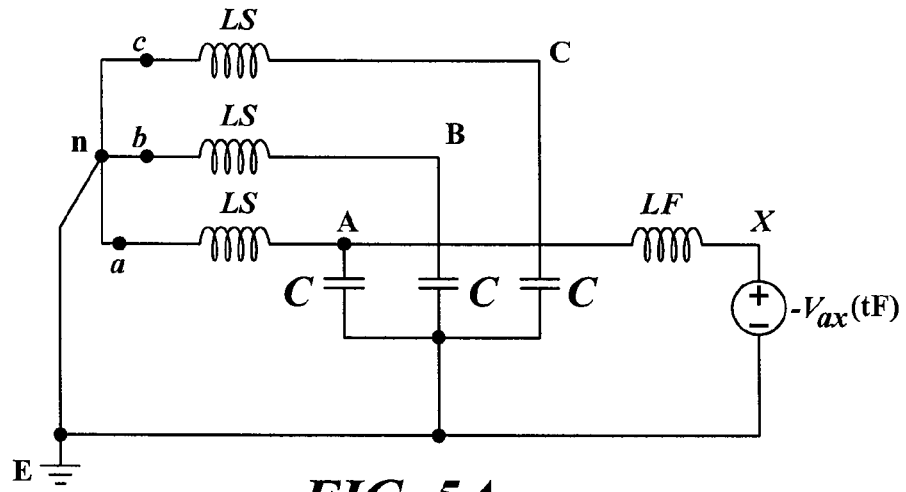
FIGS. 5A and 5B comprise a circuit diagrams of circuits showing one example of a fault according to various embodiments of the present invention.
Figure 5B:
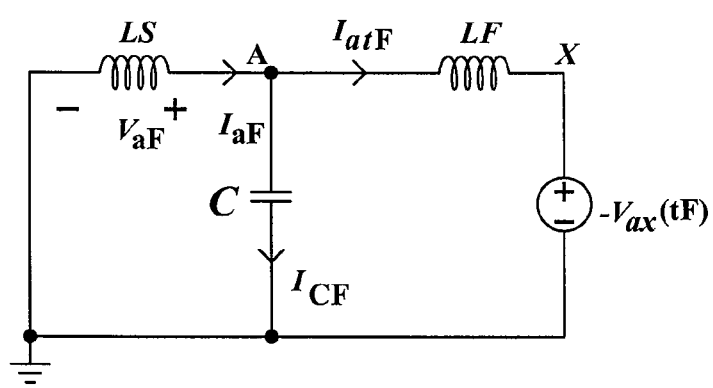

Rearranging the circuit of FIG. 5A, after eliminating the two branches of phases B and C due to the fact that they are equivalently shorted to the ground, leads to a much simplified circuit of FIG. 5B, which has only phase A components of source inductance (LS) and a capacitor C along with the line inductance (LF) to the fault location X (LF).

Referring to FIG. 5B, VaF and IaF are the net phase A fault voltage and current, respectively, at the substation bus contributed only by the injected voltage source. The injected voltage at X is the same as the normal voltage at the bus at time tF since there is no current flowing through LF in the normal (no-fault) situation. In other words, Vax(tF)=VaN(tF). The net fault voltage and current, VaF and IaF, are indirectly available from the substation recoding device by subtracting the nominal values from the values during fault. With the injected voltage as the sole source, the circuit of FIG. 5B is the subject of a simple transient response problem when a DC voltage is switched to the circuit at time tF, which can be solved by using time domain differential equation approaches or frequency domain (or s-domain) approaches as known to those skilled in the art.

The approaches described herein for the determination of transitory and sub-cycle fault location utilize time domain differential equations that provide simpler implementation using sample data values. However, s-domain analysis can be equally applicable following the same equivalent steps described herein. Taking the time domain differential equation approach, the source inductance formula is determined, from the relationship that VaF=−LS*dIaF (where dIaF is the first derivative of IaF), as LS=−VaF/dIaF. This equation for source inductance is established only during a fault and can be used as a discriminator for the presence and absence of fault event. Under normal (non-fault) conditions, LS is indeterminate or zero due to no net fault voltage and current under the situation. Referring to FIGS. 5A and 5B again, the fault distance equation for LF is: LF=[VaF+VaN(tF)]/[dIaF−C*ddVaF], where ddVaF is the second derivative of VaF. This fault distance equation for a phase A to ground fault can be applied to other phase line to ground faults by simply using the variables of the faulted phases. Therefore, for phase B faults, the LF equation becomes [VbF+VbN(tF)]/[dIbF−C*ddVbF]. And, for phase C to ground faults, the equation is changed to [VcF+VcN(tF)]/[dIcF−C*ddVcF].

Figure 6:
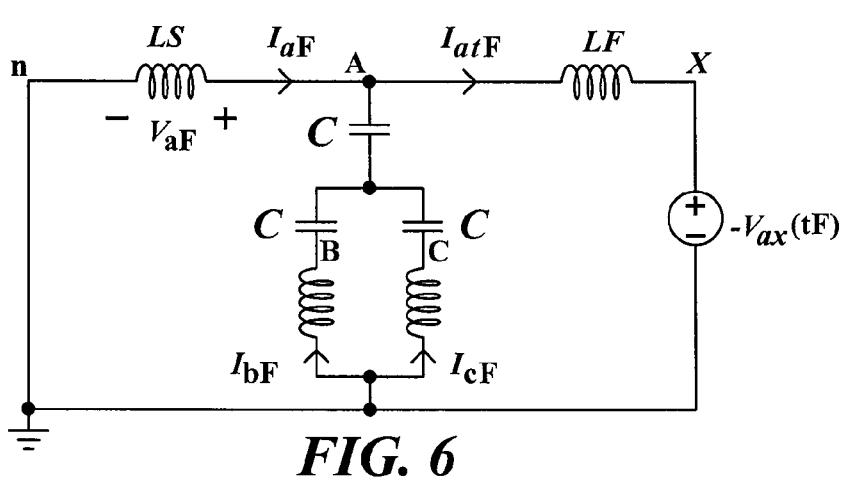
FIG. 6 comprises a circuit diagram of a circuit showing one example of a fault according to various embodiments of the present invention.

When the switch S of FIG. 4 is disconnected, the Y-connected capacitors are now ungrounded, and the circuit for the phase A to the ground fault condition is reduced to the circuit of FIG. 6. As can be seen, at the node A of the combined branches, since the combined net fault current from B and C flows into the node A, the current through LF is the sum of the three net fault current components (IaF+IbF+IcF) that, in turn, can be expressed as the net fault residual current, IrF, which is by definition the sum of 3 phase net fault currents. Then, the fault distance LF formula for a phase A fault in ungrounded capacitor bank is LF=[VaF+VaN(tF)]/dIrF, where dIrF is the first derivative of IrF. The formulas for phases B and C can be similarly derived.

When the capacitor C component is ignored from the formulas in the grounded and ungrounded capacitor bank cases, the only change brought in to the formula for a situation where there is no capacitor bank is in the denominator: for phase A to ground fault, the denominator is simply dIaF. Therefore, the fault distance LF for a phase A to ground fault when there is no capacitor bank is LF=[VaF+VaN(tF)]/dIaF. LF for another phase can be computed using the same formula but using values for the selected phase rather than those for phase A.

Figure 7:
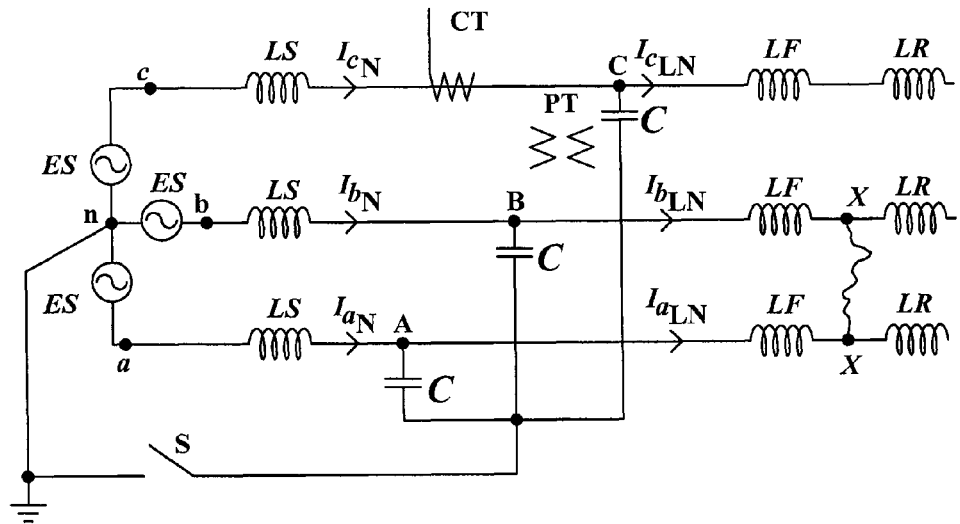
FIG. 7 comprises a circuit diagram of a circuit showing one example of a fault according to various embodiments of the present invention.

The case of a line-to-line fault without ground involvement is illustrated in FIG. 7 with similar elements used as were used with respect to FIG. 4. To take one example, the line-to-line fault distance determined in FIG. 7 is for a phase A and B fault ("AB fault"). Fault distance formulas for other line-to-line faults, BC and CA faults, can be similarly derived in the same manner as that for AB fault. With the capacitor node grounded, the circuit under fault at location X is now simplified to a circuit of FIG. 8 with injection voltage, the voltage between A and B at normal situation at the fault inception time, Vabx(tF), and inductors and capacitors of phases A and B only. As explained herein with regard to the phase A to ground fault formula derivation, the injection voltage Vabx(tF) is the same as the normal line-to-line voltage at the bus at time tF: VabN(tF)=Vabx(tF), where VabN=VaN−VbN.

Figure 8:
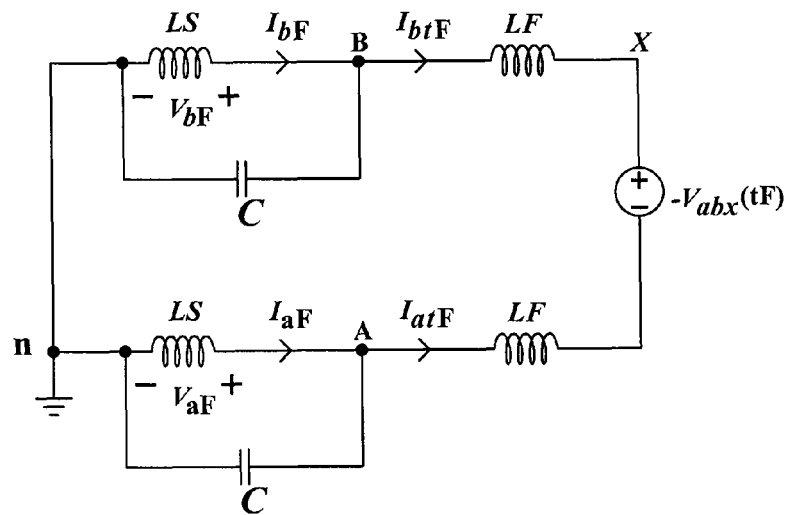
FIG. 8 comprises a circuit diagram of a circuit showing one example of a fault according to various embodiments of the present invention.

Now again referring to the circuit of FIG. 8, the two current equations at two nodes A and B can be determined to be used later for LF equation: IaIF=IaF−C*dVaF (at node A) and IbIF=IbF−C*dVbF (at node B). The voltage equation around the main loop, not including the capacitors, leads to the following equation for LF: LF*[dIaIF−dIbIF]=[VaF−VbF]−VabN(tF), where dIaIF and dIbIF are the first derivatives of IaIF and IbIF, respectively. Applying the relationships that VaF−VbF=VabF and IbIF=−IaIF, the equation for LF can be determined as: LF=[VabF−VabN(tF)][2*(dIaF−C*ddVaF)]. Alternatively, further reducing the circuit of FIG. 8 to a single loop circuit with combined LF's and LS's, an alternative equation could be determined to be in a slightly different, but similar format of LF=[VabF−VabN(tF)]/[(dIabF−C*ddVabF)], where IabF=IaF−IbF.

Figure 9A:
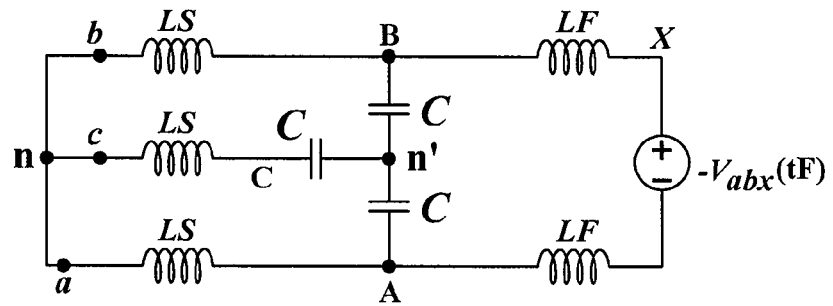
FIGS. 9A, 9B and 9C comprise circuit diagrams of a circuit showing one example of a fault according to various embodiments of the present invention.
Figure 9B:
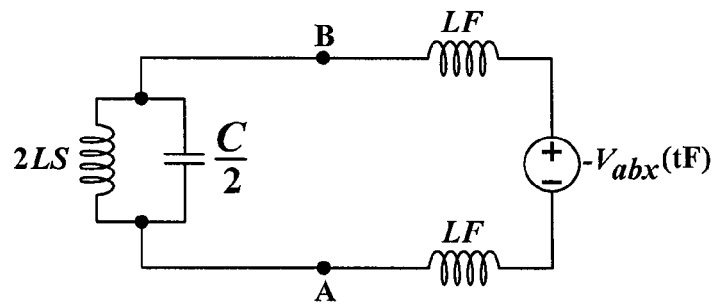

The circuit for AB fault with ungrounded Y-connected capacitor bank can be simplified to the circuit shown in FIG. 9A. Referring to FIG. 9A, the two Y-connected components, the source inductors at node n and the capacitors at node n', can be converted to two Delta components and further to a parallel component of one inductor of 2*LS and one capacitor of C/2. The simplified circuit is illustrated in FIG. 9B, which can be further simplified to the circuit of FIG. 9C by combining the two LF's of the circuit.

Figure 9C:
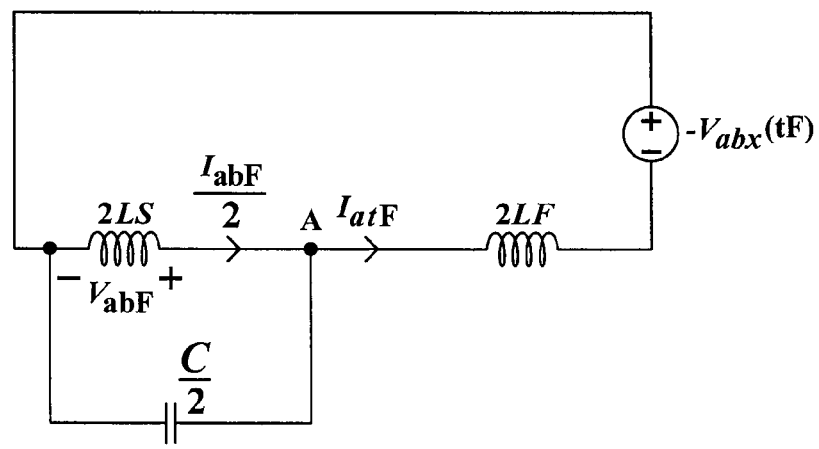

Referring to FIG. 9C, by combining the current equation at node A, IaIF=IabF/2−[C*dVabF]/2, and the voltage equation in the main loop, VabF+2*LF*dIaIF+VabN(tF)=0, the fault distance LF formula for AB fault under ungrounded capacitor condition can be determined as LF=[VabF−VabN(tF)]/[(dIabF−C*ddVabF)], which is the same as that under grounded capacitor bank. Ignoring the term with capacitor C, the AB fault formula for no capacitor bank case is determined as LF=[VabF−VabN(tF)]/dIabF.

The cases for a three line fault ("ABC fault") are similar to the AB fault formula in the fault distance calculation. This can be proved by the similar analysis described for AB fault case above. The LF formula for distance to fault for ABC fault is identical to that of AB (or any line-to-line) fault for each of the three capacitor connection cases.

Figure 10:
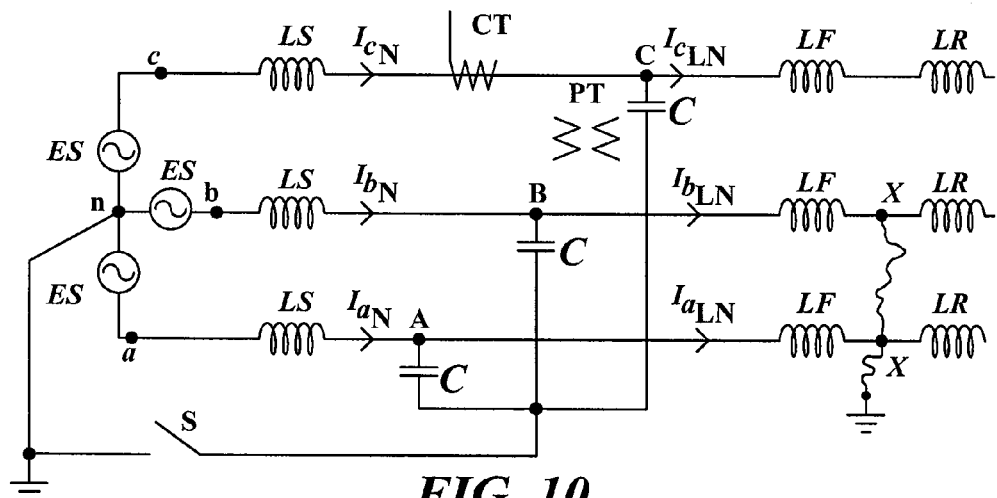
FIG. 10 comprises a circuit diagram of a circuit showing one example of a fault according to various embodiments of the present invention.
Figure 11:
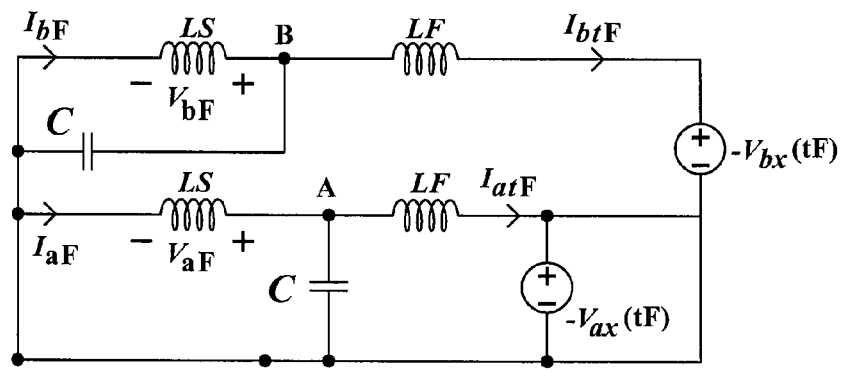
FIG. 11 comprises a circuit diagram of a circuit showing one example of a fault according to various embodiments of the present invention.

The phase AB to ground fault, "ABE fault" as a typical but equally applicable to other line-to-line-to-ground faults, in a 3-phase circuit system is diagrammed in FIG. 10. The circuit diagram of FIG. 10 can be reduced to that of FIG. 11 with the two injection voltages for phase A and B with the same magnitude since the X points are conjoined at the same point in both lines. The two independent voltage equations around the main loop and the inner loop, respectively, generate two equivalent fault distance formulas for LF, each identical to that of phase A (or B) to ground fault. Specifically, the equivalent two voltage equations for LF are determined to be: LF=[VaF+VaN(tF)]/[dIaF−C*ddVaF]=[VbF+VbN(tF)]/[dIbF−C*ddVbF]. A further simplification of the circuit diagram produced a different form of LF equation, but it would be just a variation of the formula described here. Therefore, other alternative formulas in various forms with different terms can be possible but are the same as those explicitly described herein.

Figure 12:
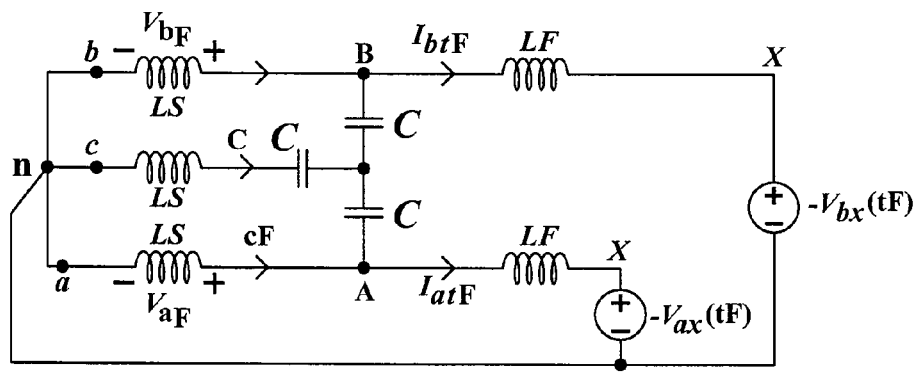
FIG. 12 comprises a circuit diagram of a circuit showing one example of a fault according to various embodiments of the present invention.

For the ungrounded capacitor case, the ABE fault circuit can be diagrammed to a circuit in FIG. 12, and two voltage equations can be derived in the two major loops: one including only phase A inductors and ground and the other, only phase B inductors and the ground. Also, again referring to FIG. 12, at node n, a relationship that the sum of two line current are the same as the sum of three phase currents flowing in the source inductances can be described as IaIF+IbIF=IaF+IbF+IcF=IrF. Combining the two voltage equations and the current relationship lead to the following formula for fault distance LF: LF=[VaF+VaN(tF)+VbF+VbN(tF)]/dIrF. This LF equation can be expressed by two familiar terms, which are identical to the formula of phase A (and B) to ground fault: LF=[VaF+VaN(tF)]/dIrF+[VbF+VbN(tF)]/dIrF=LF(AE fault formula)+LF(BE fault formula). Again, a further simplification of the circuit diagram or expression such as, applying VaN(tF)=VbN(tF) condition for they have the same voltage at the fault inception time, would produce a different form of LF than the one described here, but it is just a variation of the formula. Hence, as already noted other formulas of various forms with different terms are possible and would be similar to those explicitly described herein.

Ignoring the term with capacitor C, the ABE fault formula for no capacitor bank case is determined as LF=[VaF+VaN(tF)]/dIaF=[VbF+VbN(tF)]/dIbF which is identical to the LF formula for AE or BE fault.

By applying the same analysis and circuit simplification approach applied in the ABE fault example, the fault distance formula for three line to ground fault ("ABCE fault") are as follows. For grounded capacitor case, the fault distance is the same as that of any single phase to ground fault: LF=[VaF+VaN(tF)]/[dIaF−C*ddVaF]=[VbF+VbN(tF)]/[dIbF−C*ddVbF]. For ungrounded capacitor case, the fault distance is the sum of three LF's for AE, BE, and CE faults: LF=[VaF+VaN(tF)]/dIrF+[VbF+VbN(tF)]/dIrF+[VcF+VcN(tF)]/dIrF. On the other hand, the formula for no capacitor case is easily derived from the grounded case with C eliminated: LF=[VaF+VaN(tF)]/dIaF=[VbF+VbN(tF)]/dIbF=[VcF+VcN(tF)]/dIcF.

As described above, the fault distance formulas are good for specific and corresponding fault types or classes. As a summary of fault distance formula, the following shows the fault distance formula for each of the fault classes under three different types of capacitor bank connection method (Grounded (GC), Ungrounded (UC), and No Capacitor Bank (NC)).

AE Fault:

GC: $[VaF+VaN(tF)]/[dIaF-C*ddVaF]$

UC: $[VaF+VaN(tF)]/dIrF$

NC: $[VaF+VaN(tF)]/dIaF$

BE Fault:

GC: $[VbF+VbN(tF)]/[dIbF-C*ddVbF]$

UC: $[VbF+VbN(tF)]/dIrF$

NC: $[VbF+VbN(tF)]/dIbF$

CE Fault:

GC: $[VcF+VcN(tF)]/[dIcF-C*ddVcF]$

UC: $[VcF+VcN(tF)]/dIrF$

NC: $[VcF+VcN(tF)]/dIcF$

AB Fault:

GC: $[VabF-VabN(tF)]/[2*(dIabF-C*ddVabF)]$

UC: $[VabF-VabN(tF)]/[(dIabF-C*ddVabF)]$

NC: $[VabF-VabN(tF)]/dIabF$

BC Fault:

GC: $[VbcF-VbcN(tF)]/[2*(dIbcF-C*ddVbcF)]$

UC: $[VbcF-VbcN(tF)]/[(dIbcF-C*ddVbcF)]$

NC: $[VbcF-VbcN(tF)]/dIbcF$

CA Fault:

GC: $[VcaF-VcaN(tF)]/[2*(dIcaF-C*ddVcaF)]$

UC: $[VcaF-VcaN(tF)]/[(dIcaF-C*ddVcaF)]$

NC: $[VcaF-VcaN(tF)]/dIcaF$

ABE Fault:

GC: $[VaF-VaN(tF)]/[(dIaF-C*ddVaF)]$

UC: $[VaF+VaN(tF)]/dIrF+[VbF+VbN(tF)]/dIrF$

NC: $[VaF+VaN(tF)]/dIaF$

BCE Fault:

GC: $[VbF-VbN(tF)]/[(dIbF-C*ddVbF)]$

UC: $[VbF+VbN(tF)]/dIrF+[VcF+VcN(tF)]/dIrF$

NC: $[VbF+VbN(tF)]/dIbF$

CAE Fault:

GC: $[VcaF-VcaN(tF)]/[(dIcaF-C*ddVcaF)]$

UC: $[VcF+VcN(tF)]/dIrF+[VaF+VaN(tF)]/dIrF$

NC: $[VcF+VcN(tF)]/dIcF$

ABC Fault:

GC: $[VabF-VabN(tF)]/[2*(dIabF-C*ddVabF)]$

UC: $[VabF-VabN(tF)]/[(dIabF-C*ddVabF)]$

NC: $[VabF-VabN(tF)]/dIabF$

ABCE Fault:

GC: $[VaF+VaN(tF)]/[dIaF-C*ddVaF]$

UC: $[VaF+VaN(tF)]/dIrF+[VbF+VbN(tF)]/dIrF+[VcF+VcN(tF)]/dIrF$

NC: $[VaF+VaN(tF)]/dIaF$

The fault distance formula for each specific fault class can be implemented according to many different algorithmic, software, and/or software structures. The example implementations described herein are for illustration purpose only to emphasize the requirements and necessary steps to be taken for a sub-cycle fault location system to properly produce the fault class and fault distance as the final outputs.

Figure 13:
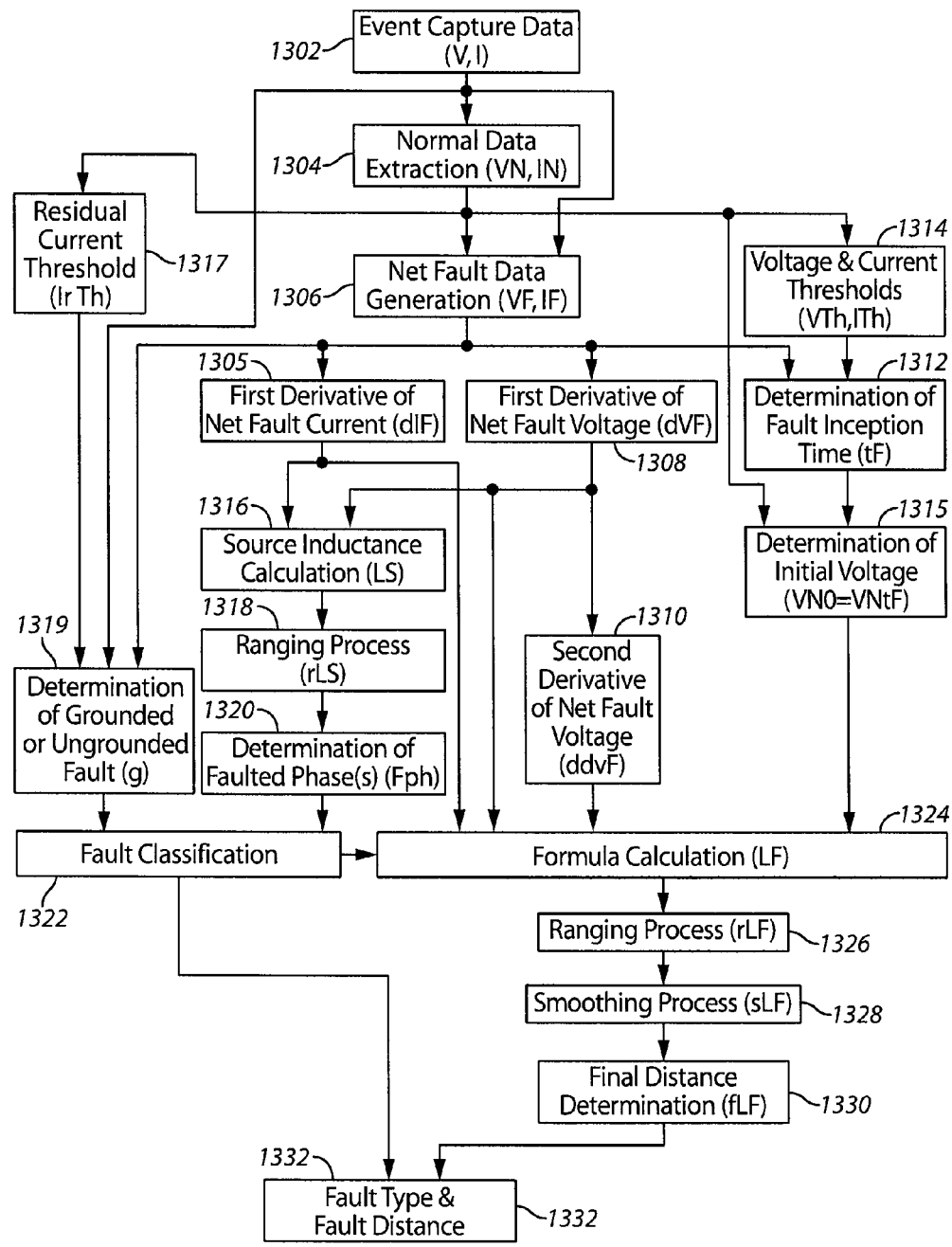
FIG. 13 comprises a flowchart showing one example of an approach that calculates a distance to a fault and determines fault type according to various embodiments of the present invention.

One example of a sub-cycle fault distance location approach is now described with respect to the flowchart of FIG. 13. In the flowchart, required data and ordered steps to produce needed terms in the formula are connected via arrowed lines for sequential advances of the steps to be taken.

At step 1302, upon the occurrence of a predetermined event (e.g., an alert such as a power outage alert) or at predetermined times or intervals, the captured raw data is read from a device which acquires and selectively stores real time voltage and current data of substation bus upon a disturbance in the network. The raw data of all three voltages and currents are expressed as Va, Vb, Vc, Ia, Ib, and Ic, respectively. The sub-cycle faults are categorized under the short transient excursion which may be detected or not by the normal protection device or conventional fault location approach. Data acquisition devices and digital relays can be used to capture massive data with high sampling rate. By setting a trigger, the capturing of data can be done selectively, for example, only for certain abnormal behavior of voltage or current, regardless of its source, fault or no fault. Typically, the digital relay and data acquisition device records, in addition to the fault event, short transient events even though the event-driven recorded data may be used for neither protection nor fault detection and location.

Figure 14:
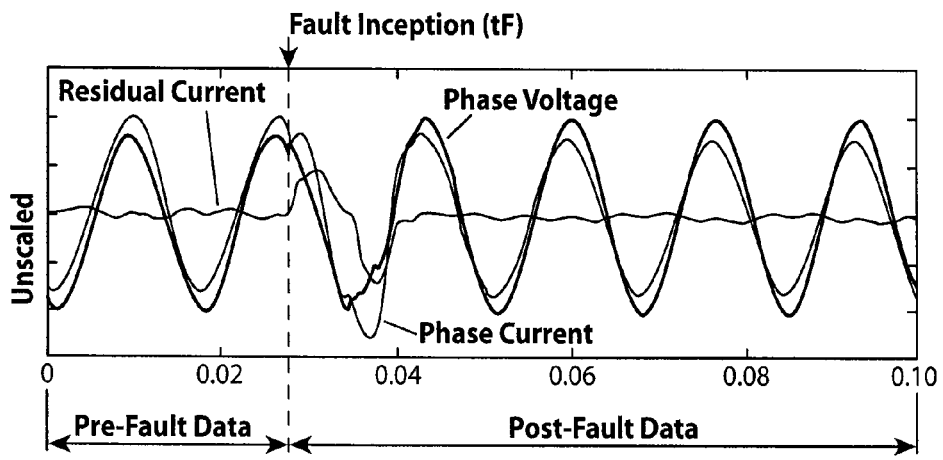
FIG. 14 comprises a diagram of electrical characteristics utilized to determine fault distance according to various embodiments of the present invention.

Referring to FIG. 14, in one example and in one typical case the recorded raw data contains the normal portion of voltage and current (termed "pre-fault data") and the portion after fault occurred ("post-fault data"), with sometimes clear time stamp (tF) of the inception of disturbance.

Referring again to FIG. 13, at step 1304 normal (no-fault) data extraction is performed. The normal data required and formed for the LF calculation is typically a multiple of subsequent one cycle length of samples of the pre-fault data taken starting from the very first of the raw data. In other words, the normal data formed from a raw data is a generated data by repeating the first 1 cycle samples of the pre-fault data until it has the same number of samples as the raw data. The normal data is formed for all phases in voltage and current (VaN, VbN, VcN, IaN, IbN, and IcN). The normal residual current (IrN) is obtained by adding all three phase normal currents. Therefore, the length of the samples in the raw data and the newly formed normal voltage and current data is the same.

Figure 15:
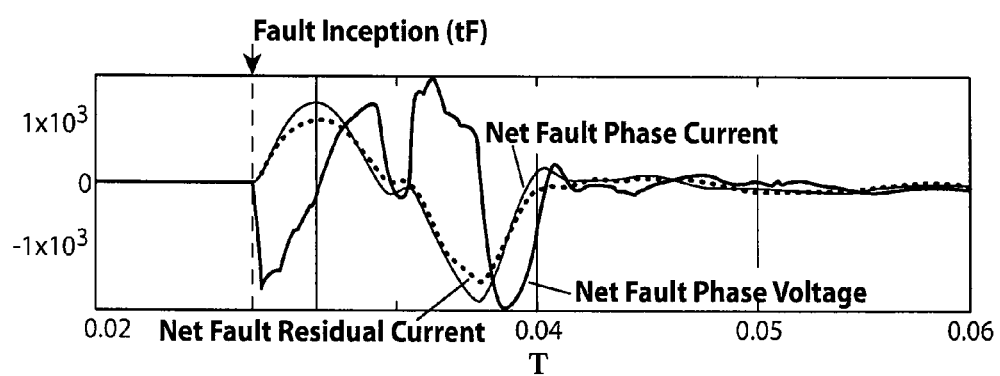
FIG. 15 comprises a diagram of electrical characteristics utilized to determine fault distance according to various embodiments of the present invention.

At step 1306, net fault data formation is performed. The net fault value for voltage (or current) for each phase is obtained by subtracting the normal value for voltage (or current) for each phase from the raw data of voltage (or current) for each phase. For example, the net phase A fault voltage (VaF) is obtained from subtracting VaN from Va, sample by sample. As expected, the net value before fault will be close to zero and, after fault, the net voltage and net current would show almost 90 degrees out of phase due to the practical assumption and reality of reactance dominant circuit. FIG. 15 shows the net fault phase voltage, the net fault current, and the net residual current of a phase to ground fault, depicting also the net phase current peaking where the net fault voltage crosses zero.

At step 1308, differentiation of the net fault value occurs. In the formulas used herein, including the one for source inductance, the first derivative of net fault value (voltage or current) is required. The differentiation process for sampled signal is now described. The numerical differentiation of sampled signals can be derived from the definition that the first derivative of a time varying signal is the rate of change of the signal with time, which is interpreted as the slope of the tangent to the signal at each sample point. Assuming that the time interval between adjacent sample points, $\Delta t$, is constant, the simplest algorithm for computing a first derivative of a voltage V (represented as dV), for example, at sample time j is: $dV(j)=[V(j+1)-V(j)]/\Delta t$. The preceding differentiation algorithm is called the first order forward difference formula for first derivative. Alternatively, by applying a Taylor expansion, a second order centered difference formula for the first derivative can be obtained as: $dV(j)=[V(j+1)-V(j-1)]/[2*\Delta t]$. Still another alternative form of the first derivative, the fourth order approximation, can be obtained as: $dV(j)=[V(j-2)-8*V(j-1)+8*V(j+1)-V(j+2)]/[12*\Delta t]$. In an example, for the real data of 128 samples per cycle obtained from a substation, the second order first differentiation is typically found to be the best choice.

Figure 16:
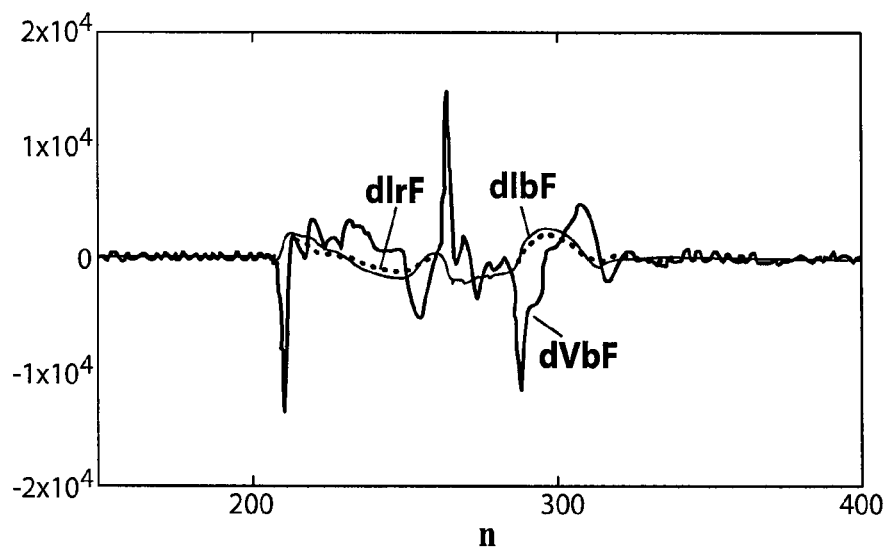
FIG. 16 comprises a diagram of electrical characteristics utilized to determine fault distance according to various embodiments of the present invention.

However, this may not be true for other situations. Therefore, the proper order must be selected. The first derivative of net value process using the numerical first derivative method applies to all net fault phase voltages and currents as well as the net residual fault current for all the samples of the variables. The illustration in FIG. 16 shows the first derivatives of net phase B fault voltage, dVbF, and net phase B fault current, dIbF, and the net residual fault current, dIrF of a phase B to ground fault.

At step 1310, a second differentiation of the net fault voltage is performed. In some fault distance formulas, especially when capacitor bank is connected in substation, the denominators of the formulas contain the second derivative of the net fault voltage. Even though an algorithm developed specifically for deriving a second order derivative directly from sampled signal can be used for the second derivative of net fault voltage, using the above-mentioned first derivative twice would be a convenient option. Using this convenient option, the following second derivatives are obtained: ddVaF, ddVbF, ddVcF, ddVabF, ddVbcF, and ddVcaF.

At step 1312, a determination of the fault inception time (tF) is made. The amount of injection in the theoretical formula at the time of fault occurrence tF, V(tF), can be obtained only when the fault inception time tF is accurately acquired. From the expression V(tF), the variable V indicates any voltage of a phase or between phases. The fault inception time can be determined by finding the earliest time when the net faulted value (of voltage or current or both) exceeds a certain threshold value. The threshold value can be set in many ways, two of which are setting the value at a predetermined fixed point and setting it at a fixed percentage point of nominal value of voltage (or current). In the first way, a threshold for fault inception in voltage can be set as 500 volt for example in 12000 volt circuit. With the second way, the threshold can be set as, for instance, 5% of the nominal voltage level. In 12000 volt distribution, the threshold with 5% would be 600 volt. In addition to these two example ways, a threshold can be set in a manner obtained on specific condition of the system with experience. For variables, net fault voltage alone can be used, or net current can be used, or both net values can be used.

Since three phases exist in the power system, all three fault inception times are independently acquired by the threshold setting approach. A practical way of finding the one and only fault inception time is to find the minimum positive value out of three possible fault inception times of three phases. The condition for a positive number is that an un-faulted phase does not have any value above the set threshold, resulting in zero (initial time of the process) as its fault inception time.

At step 1315, a determination of V(tF) is made. With the tF known, the injection voltage V(tF) can be obtained from the nominal voltage at time tF: V(tF)=VN(tF). Another way of determining V(tF) without finding the fault inception time (tF) nor reading the nominal voltage at the found fault inception time is to adopt the nominal peak voltage as the injection voltage. This approach is based on the fact that the insulation breakdown of transitory or intermittent sub-cycle fault occurs at the peak voltage point, positive or negative. Preferably, there should be a way to decide at which peak voltage, positive or negative, a fault starts. One of the ways to decide the polarity of the peak voltage is following the polarity of the net fault current. In other words, after the onset of fault, when the net fault current is computed, the polarity of the net fault current would be the same polarity for the peak voltage.

At step 1317, separation of grounded fault from ungrounded fault for fault classification is described. The fault distance formulas are specific to particular classes of faults and the classification of faults is done by identifying faulted phases and if the fault is grounded fault or not. In this section, identification of grounded or ungrounded fault is described. One way to separate grounded fault from ungrounded fault is to check the level of residual current, Ir, which is sum of three phase currents (Ia+Ib+Ic) or the net fault residual current, IrF, which is sum of the three net fault phase currents (IaF+IbF+IcF), or both at the same time. When ground is involved in the fault path, both Ir and IrF flow; in the normal situation, the sum of three phase currents in balance systems is zero.

Since the current gradually increases from fault inception time, the measuring time for Ir or IrF would be set not on the fault inception time but on the time after some time (e.g., ¼ cycle time). So, if a variable g is selected to indicate either grounded fault (g=1) or ungrounded fault (g=0), the condition for g=1 can be set as, for example, with 128 samples per cycle case: |Ir(tF+31)|>:thrIr or |IrF(tF+31)|>thrIrF, where thrIr and thrIrF are the threshold values for minimum residual and net fault residual currents, respectively. An example value of thrIr is set as 3 times the peak value of normal residual current level (thrIr=3*max(IrN)). The value for thrIrF can be set similarly. However, it should be understood that the thresholds can be set in varieties of ways utilizing experiences, power flow studies, and loading conditions.

At step 1319, separation of grounded fault from ungrounded fault for fault classification occurs. As an alternative to the residual current or net fault residual current for identifying if a fault is grounded or ungrounded, a comparison of source inductance value of a phase and that of two phases can be applied. By definition, the source inductance of a phase A is defined as LSa=−VaF/dIaF, and the (imaginary) source inductance of phases A and B as LSab=−VabF/dIabF=−[VaF−VbF]/[dIaF−dIbF]. In the AB fault (no ground involved), since VaF=−VbF, and dIaF=−dIbF, the source inductance of two phases A and B is the same as the source inductance of a phase A: LSab=−[2*VaF]/[2*dIaF]=LSa or LSb. On the other hand, in ABE (or AE or BE) fault with ground path, the source inductance of two phases LSab is much smaller than the phase source inductance LSa. The amount of the reduction in the imaginary two phase source inductance varies according to the circuit configuration particularly in capacitor bank connection and grounding practices. The average observed value LSab under phase A (or B) to ground fault with real data is 50-70% of LSa (or LSb). If, by observation and experience for a specific network condition, this alternative method of grounded/ungrounded fault separation is determined appropriate, then the following rule for grounded/ungrounded fault separation can be applied with the indicator variable g (with g=1 for=grounded fault and g=0, ungrounded fault): {g=1 if LSx>LSxy} and g=0 if LSx=LSxy}.

The subscripts x and y indicate faulted phase and un-faulted phase, respectively, and they are not the same. In many situations, for example of g=0 condition, the equality check must provide some tolerance to accommodate noises in signal and inherent approximation in sampling and digitization of data acquisition. By introducing such tolerance variable as errLS, the rules for grounded/ungrounded fault separation can be rewritten as: g=1 if {LSx>(errLS*LSxy)} and g=0 if {(LSxy*errLS)<LSx<(errLS*LSxy)}. An example value for errLS is 1.1, which gives 10% tolerance.

At step 1315, the first derivative of the net fault current is made. At step 1316, the source inductance and ranged source inductance is determined. In the preceding discussion of source inductance as a tool for separating grounded fault from ungrounded one, it was assumed that its numerical value was already obtained. However, the numerical value of source inductance is obtained through any suitable data management process. The determination of numerical value for source inductance is necessary not only for the separation but also for identifying faulted phase for fault classification, the next subject of description after this. As discussed elsewhere herein, the source impedance of phase B, for instance, is calculated by LSb=−VbF/dIbF. If the phase B is a faulted phase, then LSb has a consistent value over the duration of the fault. On the other hand, LSa or LSc in un-faulted phase is in an indeterminate state due to the almost zero net fault voltage and first derivative of net fault current in the unfaulted phase.

Figure 17:
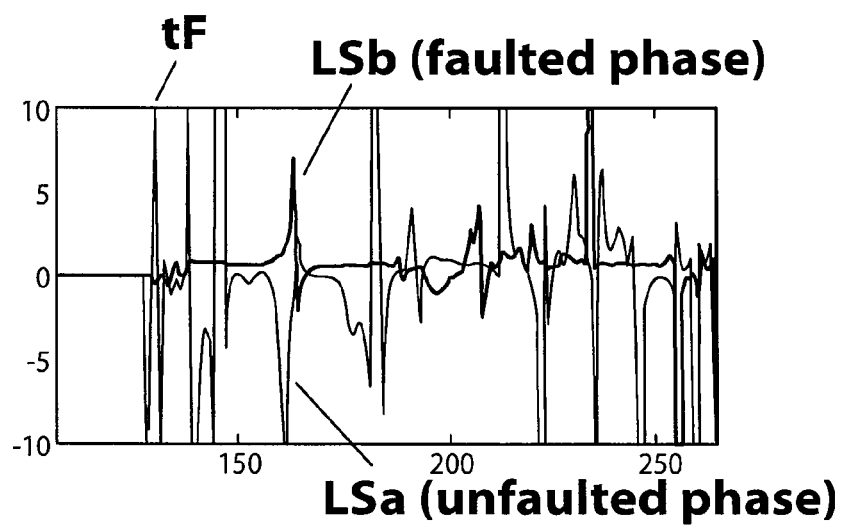
FIG. 17 comprises a diagram of electrical characteristics utilized to determine fault distance according to various embodiments of the present invention.

However, as shown in FIG. 17 (the case of the LSb (faulted phase) and LSa (un-faulted phase)), even the faulted phase source inductance, LSb, does not keep the constant value over the faulted duration due to the cyclic nature of applied voltage and thus that of net fault voltage and current. Therefore, the LSb presents an extreme value whenever the first derivative of net fault current (dIbF in the case) is zero or very close to zero. The extreme values are excluded and only the consistent values between the extreme values are to be considered for the numerical value of source inductance. This is where the ranging practice is advantageously applied. Since source inductance can be usually available (as the substation transformer equivalent inductance), a range of valid LS can be set following the transformer equivalent inductance. With the range value, bandLS, indicating the band of valid source inductance value for a given substation, the ranged value rLS can be obtained from LS, at each sample point, by converting the value of LS higher than bandLS to bandLS for rLS, and that of lower than −bandLS to −bandLS, while keeping the value in-between of LS as that of rLS. An example value for bandLS is 2.0.

At steps 1316 and 1318, a faulted phase determination by a ranged source inductance is made for fault classification. As discussed before, in normal (no-fault) situation, there is no voltage and current change, therefore, the ratio of two changes produces inconsistent, and often, random values.

Referring again to FIG. 17, it can be seen that the source inductance of faulted phase is much more consistent than that of un-faulted phase. Therefore, by analyzing the shapes of the source inductances of all three phases, the faulted phase can be determined by selecting the phase(s) whose source inductance values are consistent (which means low variance as an example measure) and stay along the line in the range of actual source inductance (which means the closeness of its average value, as an example measure, to actual source inductance). So a rule of faulted phase determination can be established, as example, by using variance and average of source inductance of each phase over a sample space after fault inception. The sample space length for the statistical measures (mean value avgrLSp and variance varrLSp) on ranged source inductance rLSp of phase p can be ¼ cycle, ½ cycle, or one cycle of the ranged source inductance. Therefore, with variable p as a variable to indicate the faulted phase (p=1 if p is a faulted phase, and p=0 if not), then the condition for p=1 can be written as: {varrLSp<thrvarrLS} & {minLS<avgrLSp<maxLS}, where the symbol & indicates the operation of a logical AND. The variable thrvarrLS is a threshold value set for the varrLSp to measure the consistency of rLSp. The range extremes, minLS and maxLS, indicate the lowest and the highest values, respectively, of actual source inductance for a given substation. Example values for thrvarrLS, minLS, and maxLS are 0.5, 0.3, and 2.0, respectively. By applying the logic rule to all three phases, faulted phase indications or a, b, and c with logic value 1 for faulted phase and 0 for un-faulted phase are produced. A combination of the three indicators, for example, (a=1, b=0, c=0), indicates a phase A fault, while another combination, for example, (a=1, b=1, c=0), indicates a phase AB fault.

Even when the actual source inductance is unknown or unavailable, the variance measure alone can be applied, without using the average measure, in faulted phase determination since the consistency in source inductance is the principal indicator of fault. Also, in replacement of the variance, varrLS, the standard deviation of the ranged source inductance, stdrLS, along with the threshold value for the standard deviation, thrstdrLS, can be applied since the both statistical measures indicate how close to or far away from the mean value of the samples. More uniform a sample indicates closer to zero variance or standard deviation. An example value for thrstdrLS is 0.5.

At step 1322, fault classification occurs. Fault classification is obtained by identifying the faulted phase(s) and recognizing if the fault is grounded or ungrounded. In one example, a rule for fault classification can be established by combining the residual current-based (or source inductance-based) grounded/ungrounded fault separation and the faulted phase determination by the consistency measure of the source inductance. The four indicators (g from the grounded/ungrounded fault separation and a, b, and c from the faulted phase identification) and their equivalents are the main parameters for an example fault classification rule described here. Calculation simplicity and structured algorithm of fault classification may be achieved by combining the four parameters, each occupying a digit position in the order of a, b, c, and g, to a single 4-digit binary number.

The digit position of each parameter can vary at any selected order. Now the four-digit binary number can indicate all possible faults, 0000 (as normal) to 1111 (as 3 phase to ground fault). For example, a binary number 0101 indicates a phase B to ground fault. Even though the binary number identification of fault class is convenient and simple in classification, the output of the classification does not have to be in binary number; it can be in any number system. A decimal equivalent of binary value will be more common way of fault classification output. For example, the binary number 1110 as ABC fault in the fault classification algorithm, its decimal equivalent 14 can be the actual output from the algorithm for displaying the fault class for users or for proving the fault class to the fault distance calculation formula module that is herein described.

Among the 16 cases in the fault classification, there are four possible numbers that cannot be connected to practical fault cases: 0001 (decimal equivalent of 1) as no-phase to ground fault and a group of 1000 (decimal equivalent of 8), 0100 (decimal equivalent of 4), 0010 (decimal equivalent of 2) as phase a, b, or c fault, respectively, without ground involvement. These four classes can be used for other valuable purposes if not for fault classification or fault distance calculation. For example, the decimal number 1 can be interpreted as a sagging wire touching ground or grounded object, and the second group of decimal numbers 2, 4, and 8 can be interpreted as a single phase fault with very high fault impedance, possibly high impedance fault. However, the accurate interpretation of these four cases has to be applied with care and proper analysis in light of experience and specific network conditions.

At step 1324, selective application of fault distance formula occurs. After the fault classification as been made, a specific fault distance formula of a fault class will be selected, executed, and its result of fault distance LF will be produced.

Figure 18:
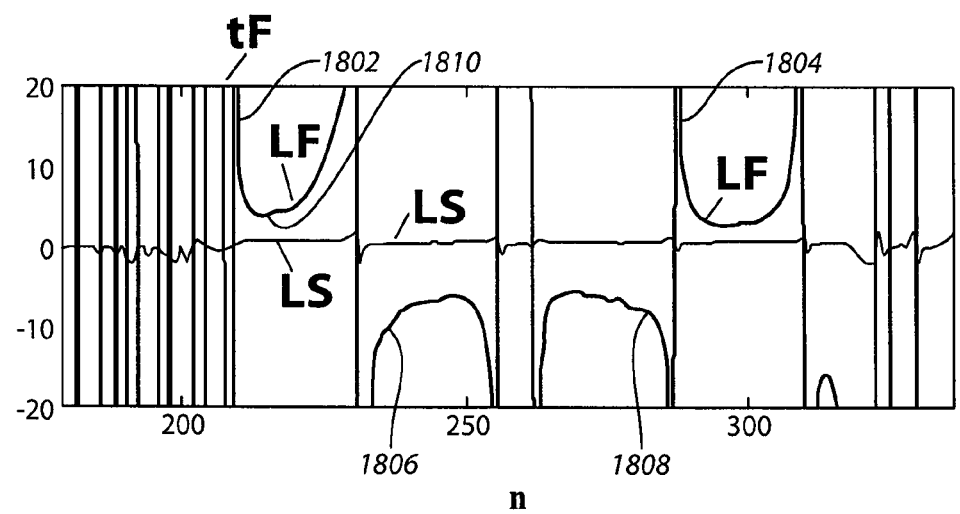
FIG. 18 comprises a diagram of electrical characteristics utilized to determine fault distance according to various embodiments of the present invention.

At step 1326, ranging for fault distance output (rLF generation) occurs. Referring to FIG. 18, the fault distance output, LF ("inductance to fault"), like the source inductance LS, would show a consistent value over the duration of the fault for a faulted phase but with invariably, due to the cyclic nature of applied voltage and thus net fault voltage and current and their first and second derivatives, extreme values resulted from zero or near zero value of the denominator of the fault distance formula.

As can be seen in FIG. 18, the source inductance of the faulted phase with consistent values from the fault inception time tF until the time when the fault symptom ends. The vertical axis represents inductance values and the horizontal axis represents time. The value tF is the time of the beginning of the fault. LS is the source inductance (measured in Henries [H]) and LF is the computed fault inductance (measured in Henries [H] and representing distance to the fault). As explained herein, the approaches herein can use the information from the distance-to-inductance chart of cable or wire to determine the distance to the fault.

For the LF with spurious extreme values, as in source inductance conditioning, it must also be conditioned to exclude the spurious values and, in addition, smooth the noisy values. The positive LF values are the subjects of the conditioning. The extreme value elimination can be done by, for example, using the same way of ranging the source inductance but by a slightly different ranging approach. Setting the range value, bandLF, to indicate the band of distance to fault value for a given substation and its circuits, the ranged value rLF can be obtained from LF, at each sample point, by converting the value of LF higher than bandLF to 0 (zero) for rLF, and that of lower than −bandLF to 0 (zero), while keeping the value in-between of LF as that of rLF. An example value for bandLF, which could be accurately determined by the length of circuit from substation bus, is 15.

At step 1328, smoothing of the ranged fault distance (sLF generation) occurs. The calculation of LF involves obtaining a second derivative of net fault values, therefore the LF output is more prone to signal noise and digitization error and numerical differentiation. Therefore, the consistency of LF is less prominent than source inductance.

Finding the LF in the consistent or stabilized duration requires an additional conditioning of the rLF values with a smoothing process. For smoothing, many different ways of making the effect can be applied. A smoothing on Gaussian kernel based computation of local weighted averages is useful if rLF values lie along a band of relatively constant width. On the other hand, if the rLF lies scattered along a band whose width fluctuates considerably, an adaptive smoother would be more appropriate, which uses a symmetric nearest neighbor linear least-squares fitting procedure. Alternatively, a median smoother which computes residuals and smoothes the residuals of rLF is known to be most robust since it is least likely to be affected by spurious values of noisy rLF values. The median smoothing can be achieved by setting the smoothing window length which is small compared to the sample length of LF. For example, for a sample length of ½ cycle (for example case of 64 samples for 128 samples/cycle sampling of signal) for rLF, a smoothing window of 1/16 cycle (namely, 8 samples in the above sampling method of 128 samples/cycle) can be set to smooth the rLF values at each sample point to generate the smoothed fault distance sLF samples.

At step 1330, averaging of smoothed fault distance values (fLF generation) occurs. As explained elsewhere herein, whenever the denominator of the fault distance equation is zero or near zero, there exist extreme values in the fault distance, and stabilized and consistent values between two extreme values. If a fault has only one stabilized and consistent fault distance value, the very distance would be produced as the final fault distance (fLF). However, if the fault lasts more than a half cycle, there usually are two or more stabilized and consistent value segments if a chosen sample window (of sLF calculation) is long enough to contain them. For example as in FIG. 18, it can be seen that there are several stabilized LF curves 1802, 1804, 1806, and 1808.

In such a case, there are several options to produce the final fault distance. The first option is to pick the first stabilized segment, curve 1802 of FIG. 18 for example, no matter how many such stabilized/consistent value segments exist in the sample window of fault distance calculation. This position is based on the notion that the very inception of fault and very first characteristics of the circuit under fault condition are contained in the first segment. This position is also applicable when there are only two segments. The second option is to use the average of all the stabilized/consistent values of fault distance within the sample window, which is based on the notion that the combined values would be more close to the would-be steady-state post-fault situation of the circuit. The third option, taken when there are three or more stabilized/consistent value segments, is taking the position of compromise between the first and the second options: Pick a pair of least-difference segment values of out of all possible pairs and get the average values of the pair. For example, the final fault distance, fLF, can be produced from sLF via the third option.

At step 1332, fault distance and type are presented to the user. The output of final fault distance along with fault class can be utilized for fast fault location and restoration scheduling. In addition, due to the transitory and intermittent fault nature of the sub-cycle disturbances and the capability of locating such nonpermanent faults, the present approaches also help to preventively maintain lines and cables before transitory events lead to permanent faults. This capability enables to early locate momentary/transitory faults before they progress to permanent faults/outages. The location of intermittent/transitory faults in urban underground cables of insulation breakdown or in overhead lines of sporadic arcing in rural wooded areas thick with brush and susceptible to high winds could eliminate a great portion of the root cause of the outage in power networks.

The approaches described herein can be applied in numerous ways for the principal purpose of sub-cycle fault location and other related objectives such as power line status monitoring, underground cable insulation monitoring, and vegetation control and management in the power line corridor. The approaches described herein also efficiently provide the user with less frequent and shortened response time to outages and improved reliability by the means of fast and accurate location of permanent and momentary faults and with the subsequent benefit of effective control of the root cause of the outages.

The sub-cycle fault location approaches described herein can be implemented and installed at any computer platform (e.g., microprocessor with associated circuitry) with any type of computer code or coding scheme that implements these algorithms. The computer platform may receive substation event monitoring data in any medium, format, and/or form that the computer platform can utilize and process.

The determined fault distance and fault class output can be applied as a stand-alone system of sub-cycle fault location without using or receiving aid from any other fault/outage control or management tools that might be available or running in the customer perimeter. In this stand-alone application, the sub-cycle fault location system produces the two outputs in more than one readable or recognizable format: annunciation, light, text, and so forth.

Further, the approaches described herein as to fault distance and fault class determination can be used in combination with a circuit analysis/modeling system which is capable of producing a table of inductance and physical location of a circuit at every important node. Alternatively, the sub-cycle fault location system can work with such inductance-location table if available without interconnection with circuit analysis/modeling system. Preferably, a circuit table of relating circuit impedance to every pole, manhole, hand-hole, or any important point of a circuit would be more efficiently used for fast sub-cycle fault location. With supplied fault class and fault distance (indicated as an inductance), the table would quickly match the fault location in or near a pole, manhole, hand-hole, or a point of importance.

More preferably, the sub-cycle fault location system can be used as a crucial fault locater and anticipator for outage management system which would have access to and control of entire power network with tele-metering and tele-monitoring with geographical information system and flexible information infrastructure for the purpose of fast fault location and quick restoration as well as preventive maintenance. The fault distance provided by the sub-cycle fault location can be used as the sole information or an additional confirmative information for permanent faults and as the essential information for otherwise unreported but surely intermittent faults to the outage management system. The information on permanent faults would enhance the restoration activity and the information on intermittent faults and would improve condition-based maintenance of cables and wires and other related equipment or tree/vegetation controls.

The above-mentioned applications, stand-alone and combination, can be achieved by providing all possible mediums for displaying and communicating the fault distance result and fault class. The data format of the two outputs from the sub-cycle fault location system can be of any compatible one with the system where the table (or table generation) resides and the table matching and/or geographically displaying the matched result occur, and with the outage management system.

In other examples, fault direction (or indication) and location may be made from a measuring point on the same line and a different line of the same bus. At a substation, typically many lines (or feeders) are connected to a junction line (i.e., a bus). A bus is served by a source. Consequently, all the lines in a bus are supplied by the same source. The direction of a fault may be different in its meaning in different situation or based upon its utilization in power system protection and control.

One purpose of fault direction in a substation having multiple buses is to identify if a fault is on the same bus line where the measuring point is located, at which the fault location and the fault direction are conducted, or at a different bus line. This case of fault direction may be called "bus discrimination" of fault. In a single-bus multiple-line configuration, fault direction (or indication) may be intended to discriminate a fault in the same line where the measuring point is located and the fault location and fault direction are conducted from a fault different line, both supplied by the same bus. This case of fault direction is referred to herein as "line discrimination of the same bus fault."

On the other hand, when the focus is on the same line, fault direction (or indication) may intend to find if a fault is at the source side, with respect to and separated by the measuring point location at which the fault location and the fault direction are conducted, or load (line end) side. The former is called an "upstream fault" and the latter, a "downstream fault." The present approaches may provide upstream/downstream discrimination of the same line for faults (e.g., intermittent or permanent)

Fault direction and fault location in the three typical cases described above is now described. These cases include: upstream/downstream discrimination and location of the same line fault; line discrimination and location of the same bus fault; and bus discrimination and location of fault.

By measuring the voltage and current at a location on the line, both the direction of fault, downstream or upstream, and the distance to the fault from the measuring point can be found. A downstream fault with respect to the measuring point indicates a fault occurred at a location which is farther to the power source than the measuring point. On the other hand, an upstream fault is a fault occurred at a location which is closer to the source than the measuring device. In the case discussed above for the description in which the measuring device is located at the substation, all faults are downstream faults. In those downstream faults, the source impedance is calculated by the formula, LSa=−[VaF/dIaF] for phase A to earth fault case. Since LSa cannot be a negative value, the term [VaF/dIaF] must be a negative number with its magnitude LSa. Therefore, the downstream fault can be indicated by the negative polarity of the term [VaF/dIaF].

Figure 19:
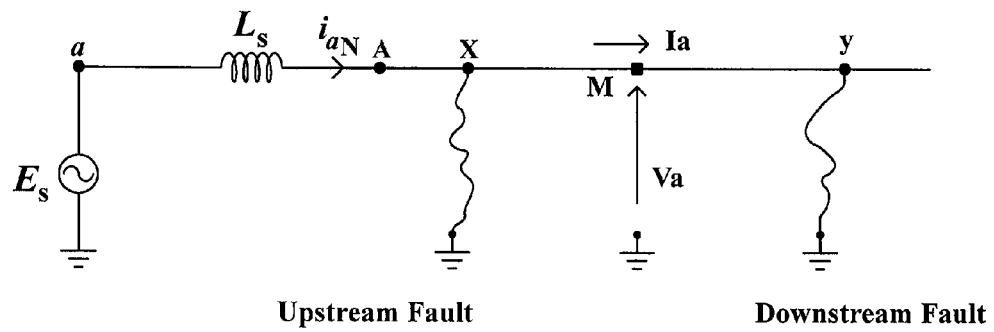
FIG. 19 comprises a circuit diagram of a circuit showing one example of a fault according to various embodiments of the present invention.

The following description further expands the polarity of the term [VaF/dIaF] to indicate fault direction in the same line and to locate the fault in terms of the line inductance from a measuring point stationed at a place on the line. In the following example, it is assumed that a measuring point, M, is located away from the substation and that an upstream fault occurs at the location x between the substation and the measuring point and, at another time, a downstream fault occurs at y between the measuring point and the end of the line, as illustrated in FIG. 19. For simplicity, a single phase equivalent (or phase A) circuit is considered with the resistance of the line and the load ignored.

Figure 20:
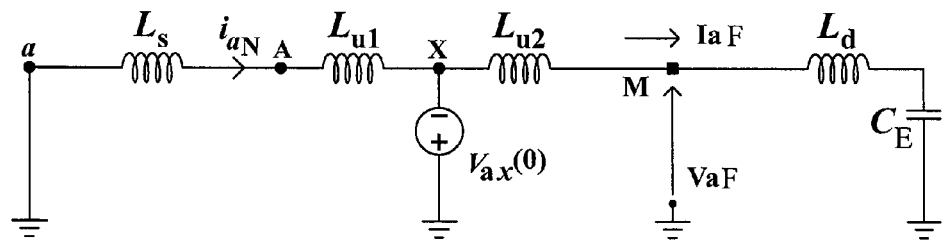
FIG. 20 comprises a circuit diagram of a circuit showing one example of a fault according to various embodiments of the present invention.

For the upstream fault, an equivalent circuit can be formed with the following variables: Lu1, the inductance of the line from the fault location to the substation (A); Lu2, the inductance of the line between the fault location and the measuring point; Ld, the inductance of the line from the measuring point to the end of the line; and CE, the capacitance between the line and the ground, which is lumped at the end of the line. Applying the superposition and signal injection approach, the equivalent circuit is shown in FIG. 20.

When CE is small and only insignificant amount of fault current flows through Ld, because the major fault current flows through the loop of the source impedance and Lu1, which in reality is usually the case, the voltage equation at the measuring point can be determined as:VaF=Ld*dIaF.

Then VaF/dIaF=Ld. Since the inductance Ld is positive, the polarity of [VaF/dIaF] is also positive. Under this condition and assumption, fault distance can be also determined.

Since Vax(0)=−(Lu2+Ld)*dIaF, and Ld=VaF/dIaF, the fault distance Lu2, from the measuring point is obtained by: Lu2=−Vax(0)=−[Vax(0)−VaF]/dIaF.

From the formula, Vax(0) can be equated to VaMN(tF), the nominal voltage at M at the fault inception time tF.

Figure 21:
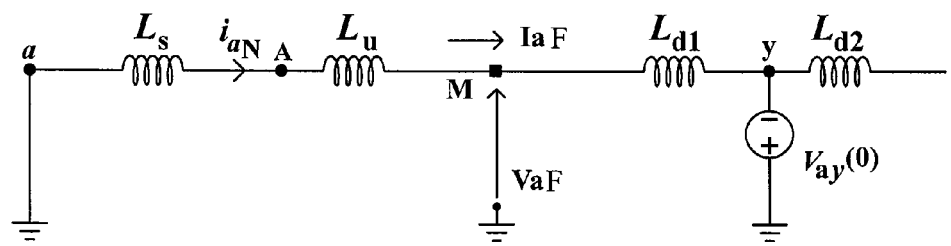
FIG. 21 comprises a circuit diagram of a circuit showing one example of a fault according to various embodiments of the present invention.

For the downstream fault at y, an equivalent circuit can be formed with the following variables: Lu, the inductance of the line from the measuring point to the substation (A); Ld1, the inductance of the line between the fault location and the measuring point; and Ld2, the inductance of the line from the fault location to the end of the line. Applying the superposition and signal injection approach, the equivalent circuit as shown in FIG. 21.

The voltage equation and the measuring point is VaF=−(Ls+Lu)*dIaF, which yields VaF/dIaf=−(Ls+Lu).

Therefore, the polarity of [VaF/dIaF] is negative. The fault distance is derived from Vay(0)=(Ls+Lu+Ld1)*dIaF and VaF/dIaF=−(Ls+Lu). Therefore, the fault distance from the measuring point, Ld1, is obtained by: Ld1=[Vay(0)+VaF]/dIaF.

From the formula, Vay(0) can be equated to VaMN(tF), the nominal voltage at location M at fault inception time tF.

For upstream faults, the polarity of [VaF/dIaF], which is obtained from the measuring point on the line, is positive, and the fault distance from the measuring point is given by Lug=−[Vax(0)−VaF]/dIaF.

For downstream faults, the polarity of [VaF/dIaF], which is obtained from the measuring point on the line, is negative, and the fault distance from the measuring point is given by Ld1=[Vay(0)+VaF]/dIaF.

Figure 22:
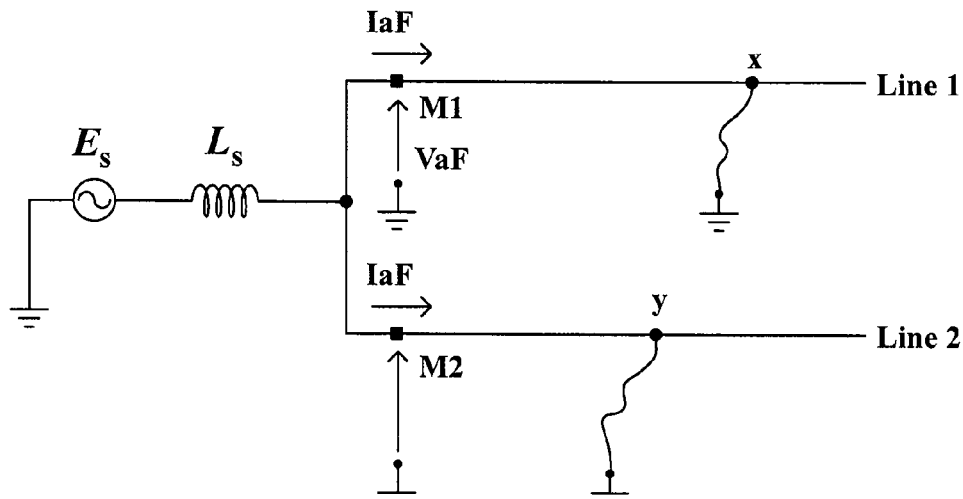
FIG. 22 comprises a circuit diagram of a circuit showing one example of a fault according to various embodiments of the present invention.

Assuming that a bus has two lines, fault direction means to discriminate if the fault is on the same line as where the measuring point is located or different line of the bus. For simplicity, a single phase equivalent (or phase A) circuit of a single-bus 2-line configuration, as illustrated in FIG. 22 is considered, with the resistance of the line and the load ignored.

Even though the equivalent circuit has two measuring points, M1 and M2, only one measuring point is used, M1 in the regard, for the description of the fault discrimination and location since one measuring point is just enough to serve the intended purpose. Then, the fault at x is the same line fault, and the fault at y the different line fault.

Figure 23:
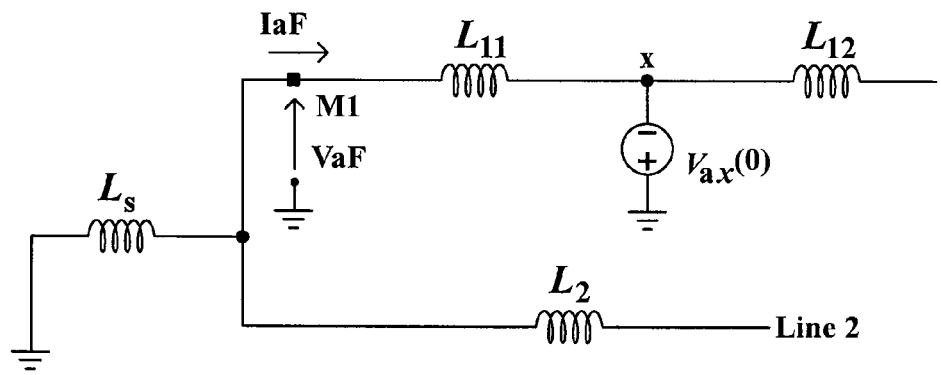
FIG. 23 comprises a circuit diagram of a circuit showing one example of a fault according to various embodiments of the present invention.
Figure 24:
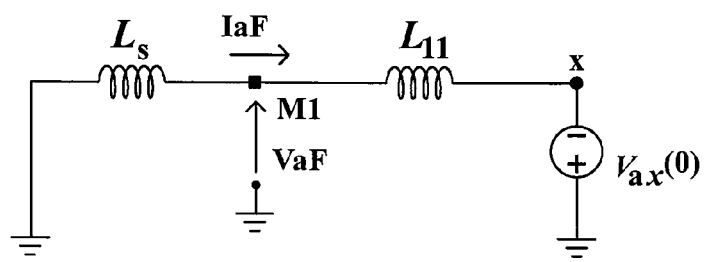
FIG. 24 comprises a circuit diagram of a circuit showing one example of a fault according to various embodiments of the present invention.

For the same line fault at x, the equivalent circuit can be formed using the variables of: Ls the source impedance, L11 the line inductance between the measuring point and the fault location x, and L12 the inductance between the fault location and the end of the line 1. Applied with the superposition and signal injection approach, the equivalent circuit can be obtained as shown in FIG. 23. This can be simplified to the circuit shown in FIG. 24.

The voltage equation at the measuring point M1 is: VaF=−Ls*dIaF. Therefore, VaF/dIaF=−Ls. The polarity of [VaF/dIaF] therefore is negative. The location of the fault, expressed by the inductance L11, obtained from the equation of Vax(0)=(Ls+L11)*dIaF, is expressed by L11=[Vax(0)+VaF]/dIaF.

Figure 25:
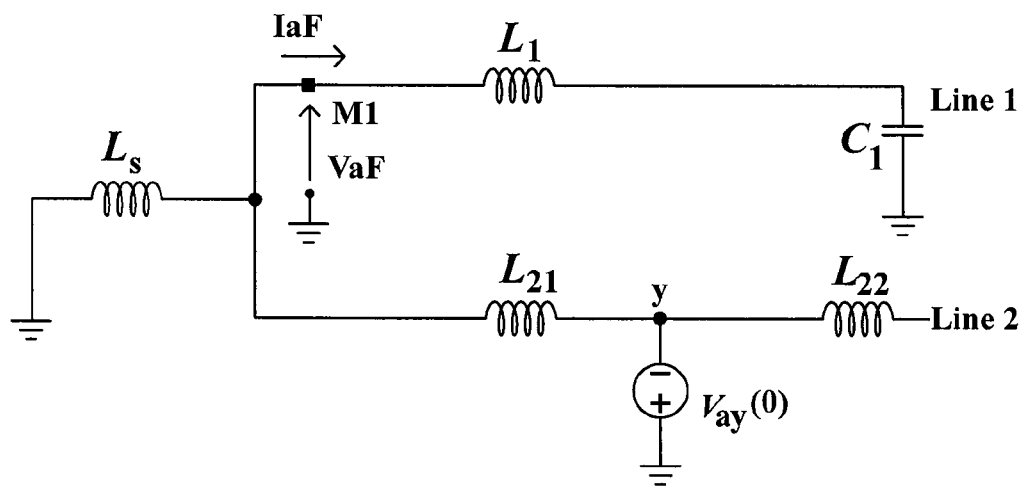
FIG. 25 comprises a circuit diagram of a circuit showing one example of a fault according to various embodiments of the present invention.

For the different line fault at y on line 2 seen from M1 on line 1, the equivalent circuit can be formed in a similar fashion using the variables of: L21 as the inductance between the substation and the fault location y, L22 as the inductance between the fault location y and the end of the line 2, and C1 as the capacitance of the line 1 to the ground, lumped at the end of line 1. Applied with the superposition and signal injection approach, the equivalent circuit can be obtained as shown in FIG. 25. The circuit is now simplified as shown in FIG. 26.

Ignoring the voltage across the C1 right after the fault inception, the voltage equation at M1 is computed as: VaF=L1*dIaF. Therefore, the polarity of [Vaf/dIaF] is positive with magnitude of L1, the overall line impedance of line 1. The fault distance from the substation in terms of the inductance L21 can be determined from the following equations: VaF=Ls*dIsF=L1*dIaF=L21*dI2F−Vay(0), dIsF=VaF/Ls, dIaF=VaF/L1, and I2F=−(IsF+IaF).

Figure 26:
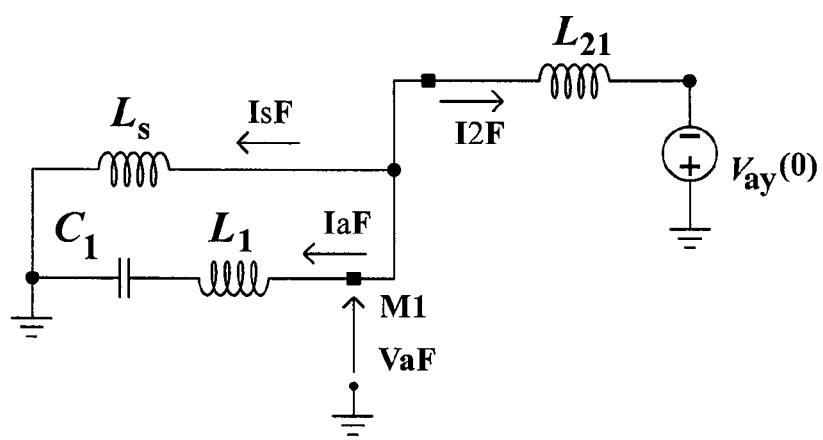
FIG. 26 comprises a circuit diagram of a circuit showing one example of a fault according to various embodiments of the present invention.

From the formula, as illustrated in FIG. 26, IsF is the net fault current in Ls and I2F, the net fault current in L21.

Rearranging them produces the formula for the fault distance L21 of the following equation: L21=−[VaF+Vay(0)]/[dIaF+VaF/Ls].

Conclusively, on the line discrimination and fault location of the same bus fault, the same line fault has negative polarity of [VaF/dIaF], which is obtained from the measuring point on the line, and the fault distance from the measuring point is given by L11=[Vax(0)+VaF]/dIaF.

For different line faults, the polarity of [VaF/dIaF], which is obtained from the measuring point on the line, is positive, and the fault distance from the measuring point is given by L21=−[VaF+Vay(0)]/[dIaF+VaF/Ls].

Figure 27:
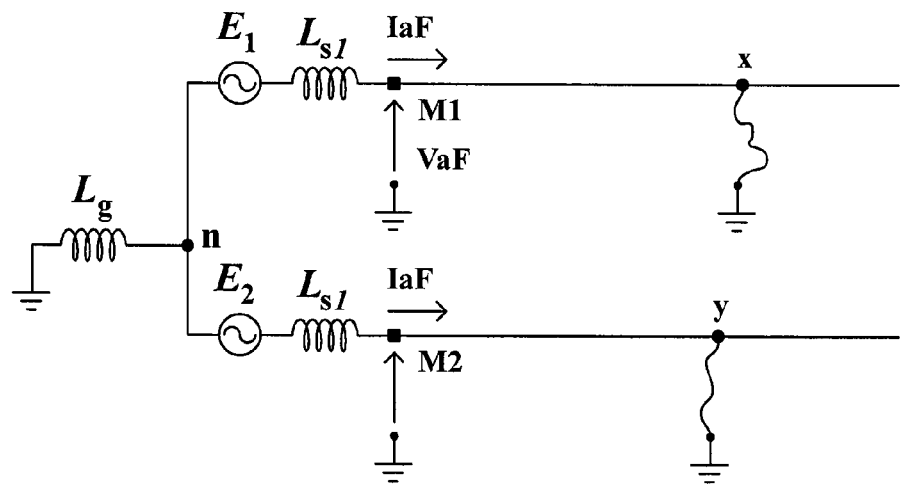
FIG. 27 comprises a circuit diagram of a circuit showing one example of a fault according to various embodiments of the present invention.
Figure 28:
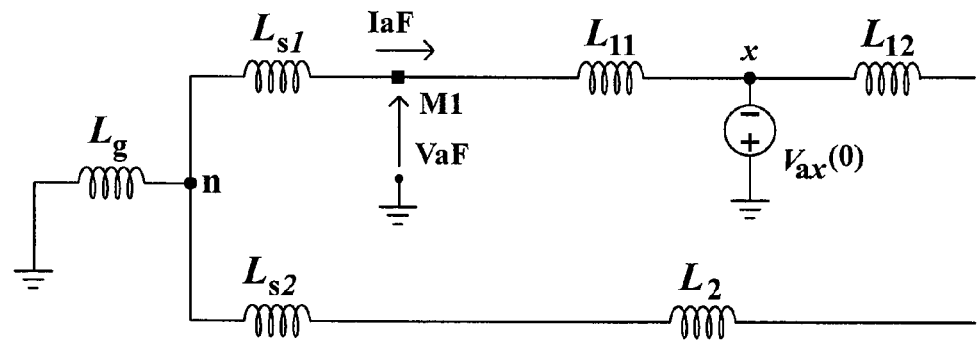
FIG. 28 comprises a circuit diagram of a circuit showing one example of a fault according to various embodiments of the present invention.

In another example, fault direction and location is directed to a substation with multiple buses. For simplicity, it is assumed that the configuration is of two-bus system with a single line to each bus. Then, the fault indication is to identify if a fault is on the same bus line as the measuring point or different bus line. As illustrated in FIG. 27, the fault at x is the same bus line fault, and the fault at y the different bus line fault. It is assumed that the two power sources are connected at the neutral point n then, through a grounding inductance, $L_g$, to the ground. Even though the equivalent circuit has two measuring points, M1 and M2, only one measuring point is used, M1 in the regard, for the description of the bus discrimination and location since one measuring point is enough to serve the intended purpose.

For the same bus line fault at x, the equivalent circuit is formed using the variables of: Lg the grounding inductance, Ls1 the bus 1 source inductance, Ls2 the bus 2 source inductance, L11 the inductance of the line 1 between the measuring point and the fault location x, L12 the line inductance between the fault location and the end of the bus line 1, and L2 the inductance of the healthy bus line 2. The superposition and signal injection approach forms the equivalent circuit as below of FIG. 28. The circuit of FIG. 28 can be further simplified to the circuit of FIG. 29.

Figure 29:
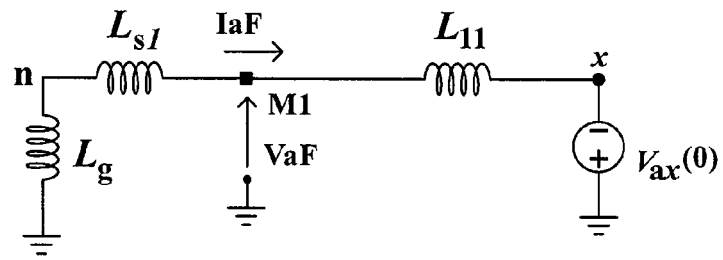
FIG. 29 comprises a circuit diagram of a circuit showing one example of a fault according to various embodiments of the present invention.
Figure 30:
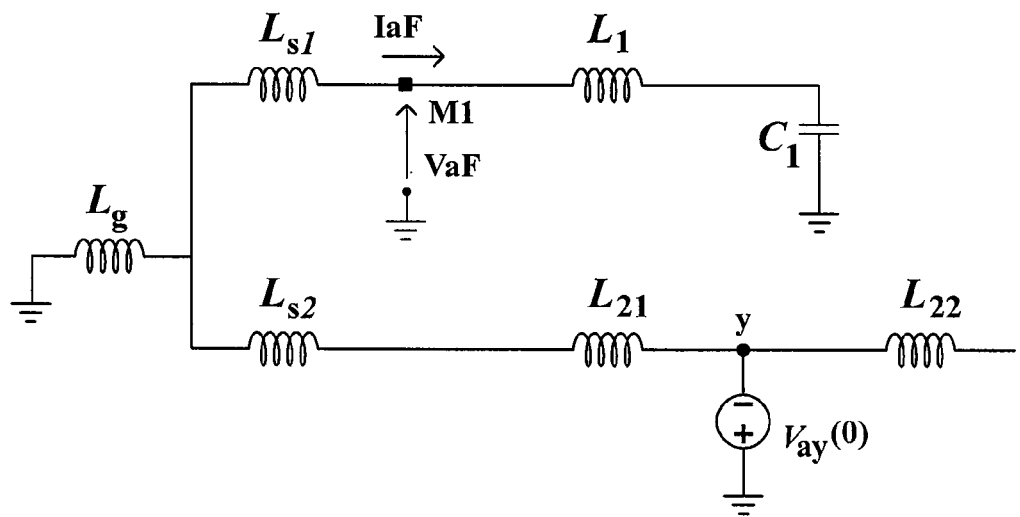
FIG. 30 comprises a circuit diagram of a circuit showing one example of a fault according to various embodiments of the present invention.
Figure 31:
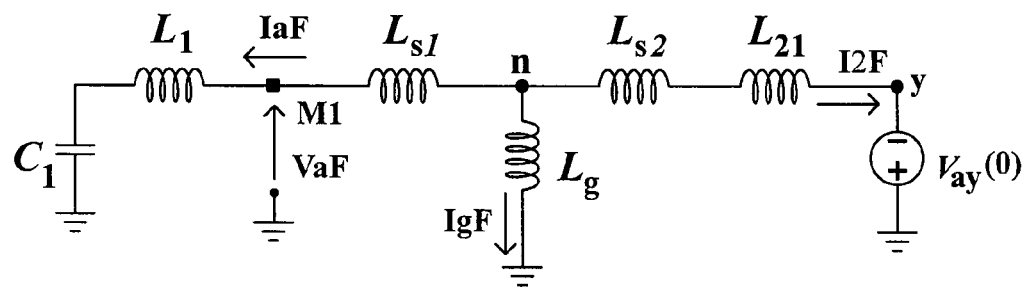
FIG. 31 comprises a circuit diagram of a circuit showing one example of a fault according to various embodiments of the present invention.

From the simplified equivalent circuit of FIG. 29, the following relationship is determined: VaF=−(Ls1+Lg)*dIaF. Therefore, the polarity of [VaF/dIaF] is negative. The fault distance from the measuring point can be determined from $Vax(0)=(Lg+Ls1+L11)*dIaF$. With the known value of the grounding inductance, the fault distance L11 is given by: $L11=[Vax(0)+VaF]/dIaF$.

For the different bus line fault at y, the equivalent circuit is formed using the variables of: Lg the grounding inductance, Ls1 as the bus 1 source inductance, $L_{s2}$ as the bus 2 source inductance, L1 as the inductance of the healthy bus line 1, L21 as the line inductance between the measuring point M2 and the fault location y, L22 as the line inductance between the fault location y and the end of the bus line 2, and C1 as the capacitance of the bus line 1 to the ground, lumped at the end of the line. The superposition and signal injection approach make the equivalent circuit of FIG. 30. The circuit of FIG. 30 can be reduced to the simplified circuit of FIG. 31.

Ignoring the voltage across the C1 right after the fault inception, the voltage equation at M1 is determined as: $VaF=L1*dIaF$. Therefore the polarity of [VaF/dIaF] for the different bus line fault is positive. The fault distance to the bus, expressed by L21 can be obtained by the following equations.

$$Vay(0)=-(L1+Ls1)*dIaF+(Ls2+L21)*dI2F, \text{ and}$$

$$Vay(0)=-Lg*dIgF+(Ls2+L21)*dI2F.$$

The difference of the above two equations yields: $dIgF=-\{[L1+Ls1]/Lg\}*dIaF$. Since $I2F=-(IaF+IgF)$, one of the above two equations of Vay(0) can be changed to:

$$Vay(0)=-(L1+Ls1+Ls2+L21)*dIaF-\{[(L1+Ls1)*(Ls2+L21)]/Lg\}*dIaF,$$

Arranging the above equation gives L21 as:

$$L21=-[Vay(0)*Lg]/[LB*dIaF]-LA/LB, \text{ where}$$
$$LA=Lg*(L1+Ls1+Ls2)+Ls2*L1+Ls1*L12 \text{ and}$$
$$LB=Lg+L1+Ls1.$$

Conclusively, for the same bus faults, the polarity of [VaF/dIaF], which is obtained from the measuring point on the line, is negative, and the fault distance from the measuring point is given by $L11=[Vax(0)+VaF]/dIaF$.

For different bus faults, the polarity of [VaF/dIaF], which is obtained from the measuring point on the line, is positive, and the fault distance from the measuring point is given by $L21=-[Vay(0)*Lg]/[LB*dIaF]-LA/LB$, where $LA=Lg*(L1+Ls1+Ls2)+Ls2*L1+Ls1*L12$ and $LB=Lg+L1+Ls1$.

While the invention herein disclosed has been described by means of specific embodiments and applications thereof, numerous modifications and variations could be made thereto by those skilled in the art without departing from the scope of the invention.

What is claimed is:

1. A method for determining the distance to electrical faults in electrical power networks, the method being accomplished in the time domain, the method comprising:
   receiving a plurality of three-phase, sinusoidal electrical waveforms over a plurality of electrical power lines in an electrical power network;
   determining a plurality of nominal electrical parameters for the electrical power network having a source voltage, the plurality of nominal electrical parameters associated with a state of the electrical power network in the absence of at least one transitory sub-cycle electrical fault in the network;
   subsequently sampling a plurality of faulted electrical parameters of the electrical waveforms when the at least one transitory sub-cycle electrical fault exists along or between any of the plurality of electric power lines in the network;
   determining a plurality of net fault electrical parameters for the electrical power network, each of the net fault electrical parameters being a difference between one of the plurality of nominal electrical parameters and an associated one of the faulted electrical parameters;
   determining a plurality of inductances based at least in part upon the net fault electrical parameters and the faulted electrical parameters, and based at least in part upon voltage injection approaches that obtain an equivalent circuit of the electrical power network, wherein the equivalent circuit is obtained in part by injecting a nominal voltage at a theoretically faulted location and by ignoring the source voltage, the plurality of inductances being representative of inductances present in the network when the at least one transitory sub-cycle electrical fault exists in the network;
   analyzing the plurality of inductances to determine a distance to the at least one electrical fault, the distance being determined regardless of when in time the fault occurs, the sub-cycle being located anywhere on any of the plurality of sinusoidal electrical waveforms.

2. The method of claim 1 wherein the plurality of sampled electrical parameters comprise voltages and currents.

3. The method of claim 1 further comprising determining a fault type based at least in part upon the plurality of sampled electrical parameters.

4. The method of claim 3 wherein the fault type is selected from the group consisting of a line-to-ground fault and a line-to-line fault.

5. The method of claim 1 wherein a comparison of the plurality of sampled parameters to the plurality of nominal electrical parameters is used to determine if a fault has occurred.

6. The method of claim 1 wherein the analyzing comprises multiplying at least some of the plurality of fault inductances by a known inductance characteristic of the power line to obtain the distance to the transitory fault.

7. A method of determining a distance to an electrical fault in an electrical power network, the electrical power network including a plurality of electrical power lines transmitting a plurality of three-phase, sinusoidal electrical waveforms, the network having a source voltage, the method being accomplished in the time domain, the method comprising:
   determining at least one first network operational parameter, the at least one first network operational parameter related to a first electrical condition of the network in the absence of a sub-cycle transitory fault, the sub-cycle transient fault being located along or between ones of the plurality of electrical power lines;
   determining at least one second network operational parameter, the at least one second network operational parameter related to a second electrical condition of the network in the presence of the sub-cycle transitory fault;
   determining at least one net fault electrical parameters for the electrical power network, the at least one net fault electrical parameters being a difference between the at least one first network operational parameter and the at least one second network operation parameter;
   determining an inductive distance to the fault based at least in part upon the net fault electrical parameters and the faulted electrical parameters, and based at least in part upon voltage injection approaches that obtain an equivalent circuit of the electrical power network, wherein the equivalent circuit is obtained in part by injecting a nominal voltage at a theoretically faulted location and by ignoring the source voltage, the distance being determined regardless of when in time the fault occurs, the sub-cycle being located anywhere on any of the plurality of sinusoidal electrical waveforms.

8. The method of claim 7 wherein determining the at least one second network operational parameter comprises sampling electrical voltages or electrical currents.

9. The method of claim 7 further comprising determining a fault type based at least in part upon at least one of the at least one first network operational parameter and the at least one second network operational parameter.

10. The method of claim 9 wherein the fault type is selected from the group consisting of a line-to-ground fault and a line-to-line fault.

11. A system for determining fault distance in the time domain, the system comprising:

an interface with an input and an output, the interface configured to receive an electrical power waveform over an electrical power line in an electrical power network at the input;

a processor, coupled to the interface, the processor configured to determine a plurality of nominal electrical parameters for the electrical power network, the electrical power network including a plurality of electrical power lines transmitting a plurality of three-phase, sinusoidal electrical waveforms and having a source voltage, the nominal electrical parameters associated with a state of the electrical power network in the absence of at least one transitory electrical fault, the processor configured to subsequently sample a plurality of faulted electrical parameters of the electrical power waveform at the input when the at least one transitory sub-cycle electrical fault exists in the network, the processor configured to determine a plurality of net fault electrical parameters for the electrical power network, each of the net fault electrical parameters being a difference between one of the plurality of nominal electrical parameters and an associated one of the faulted electrical parameters; the processor configured to determine a plurality of inductances based at least in part upon the net fault electrical parameters and the faulted electrical parameters, and based at least in part upon voltage injection approaches that obtain an equivalent circuit of the electrical power network, wherein the equivalent circuit is obtained in part by injecting a nominal voltage at a theoretically faulted location and by ignoring the source voltage, the plurality of inductances being representative of inductances present in the network when the at least one transitory sub-cycle electrical fault exists in the network, the processor configured to analyze the plurality of inductances to determine a distance to the at least one transitory sub-cycle electrical fault and present the distance at the output, the distance being determined regardless of when in time the fault occurs, the sub-cycle being located anywhere on any of the plurality of sinusoidal electrical waveforms.

12. The system of claim 11 wherein the plurality of sampled electrical parameters comprise electrical voltages and electrical currents.

13. The system of claim 11 further comprising determining a fault type based at least in part upon the plurality of sampled electrical parameters.

14. The system of claim 13 wherein the fault type is selected from the group consisting of a line-to-ground fault and a line-to-line fault.

15. The system of claim 11 wherein the distance to the at least one transitory fault is determined by multiplying at least some of the fault inductances by a known inductance characteristic of the power line.

* * * * *